United States Patent
Kim et al.

(10) Patent No.: US 11,927,838 B2
(45) Date of Patent: Mar. 12, 2024

(54) QUANTUM DOTS AND DEVICES INCLUDING THE SAME

(71) Applicant: SAMSUNG ELECTRONICS CO., LTD., Suwon-si (KR)

(72) Inventors: Tae Gon Kim, Hwaseong-si (KR); Garam Park, Seoul (KR); Jooyeon Ahn, Suwon-si (KR); Shang Hyeun Park, Yongin-si (KR); Shin Ae Jun, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/220,364

(22) Filed: Jul. 11, 2023

(65) Prior Publication Data
US 2023/0350237 A1   Nov. 2, 2023

Related U.S. Application Data

(62) Division of application No. 16/697,650, filed on Nov. 27, 2019, now Pat. No. 11,740,495.

(30) Foreign Application Priority Data

Nov. 29, 2018 (KR) .......... 10-2018-0151184

(51) Int. Cl.
C09K 11/70 (2006.01)
B82Y 20/00 (2011.01)
(Continued)

(52) U.S. Cl.
CPC .......... *G02F 1/01716* (2013.01); *B82Y 20/00* (2013.01); *C09K 11/02* (2013.01);
(Continued)

(58) Field of Classification Search
CPC ........ C09K 11/70; B82Y 20/00; H10K 50/115
(Continued)

(56) References Cited

U.S. PATENT DOCUMENTS 7,476,487 B2   1/2009  Park et al.
7,746,423 B2   6/2010  Im et al.
(Continued)

FOREIGN PATENT DOCUMENTS

EP   3184603 A1   6/2017
EP   3275967 A1   1/2018
(Continued)

OTHER PUBLICATIONS

Christian Ippen et al., "InP/ZnSe/ZnS: A Novel Multishell System for InP Quantum Dots for Improved Luminescence Efficiency and Its application in a Light-Emitting Device," Journal of Information Display, Jun. 22, 2012, pp. 91-95, vol. 13, No. 2.
(Continued)

*Primary Examiner* — Christopher M Raabe
(74) *Attorney, Agent, or Firm* — CANTOR COLBURN LLP

(57) ABSTRACT

A quantum dot including a core and a shell disposed on the core wherein one of the core and the shell includes a first semiconductor nanocrystal including zinc and sulfur and the other of the core and the shell includes a second semiconductor nanocrystal having a different composition from the first semiconductor nanocrystal, the first semiconductor nanocrystal further includes a metal and a halogen configured to act as a Lewis acid in a halide form, an amount of the metal is greater than or equal to about 10 mole percent (mol %) based on a total number of moles of sulfur, and an amount of the halogen is greater than or equal to about 10
(Continued)

mol % based on a total number of moles of sulfur, a method of producing the same, and a composite and an electronic device including the same.

20 Claims, 7 Drawing Sheets

(51) Int. Cl.
*C09K 11/02* (2006.01)
*C09K 11/08* (2006.01)
*C09K 11/62* (2006.01)
*C09K 11/88* (2006.01)
*G02F 1/017* (2006.01)
*H01L 33/06* (2010.01)
*H01L 33/28* (2010.01)
*H01L 33/30* (2010.01)
*H01L 33/34* (2010.01)
*H10K 50/115* (2023.01)

(52) U.S. Cl.
CPC ......... *C09K 11/025* (2013.01); *C09K 11/0811* (2013.01); *C09K 11/0883* (2013.01); *C09K 11/62* (2013.01); *C09K 11/883* (2013.01); *H01L 33/06* (2013.01); *H01L 33/28* (2013.01); *H01L 33/30* (2013.01); *H01L 33/34* (2013.01); *H10K 50/115* (2023.02); *G02F 1/01791* (2021.01)

(58) Field of Classification Search
USPC .......................................................... 257/79
See application file for complete search history.

(56) References Cited

U.S. PATENT DOCUMENTS

| | | | |
|---|---|---|---|
| 9,196,682 B2 | 11/2015 | Jang et al. | |
| 9,834,724 B2 | 12/2017 | Kim et al. | |
| 9,853,190 B2 | 12/2017 | Glarvey et al. | |
| 10,074,770 B2 | 9/2018 | Park et al. | |
| 10,126,587 B2 | 11/2018 | Chung | |
| 10,246,634 B2 | 4/2019 | Yang et al. | |
| 11,236,270 B2 | 2/2022 | Park et al. | |
| 2012/0032115 A1 | 2/2012 | Harada et al. | |
| 2014/0369024 A1* | 12/2014 | Xu ....................... | C08G 77/382 252/301.36 |
| 2018/0033856 A1 | 2/2018 | Kwon et al. | |
| 2018/0047878 A1 | 2/2018 | Glarvey et al. | |
| 2018/0094190 A1 | 4/2018 | Kim et al. | |
| 2018/0105739 A1 | 4/2018 | Kim et al. | |
| 2018/0142149 A1 | 5/2018 | Youn et al. | |
| 2018/0186998 A1 | 7/2018 | Ahn et al. | |
| 2018/0239245 A1 | 8/2018 | Yang et al. | |
| 2019/0006556 A1 | 1/2019 | Park et al. | |
| 2019/0072815 A1 | 3/2019 | Chung | |
| 2019/0276737 A1 | 9/2019 | Won et al. | |
| 2021/0139776 A1* | 5/2021 | Kim ....................... | C09K 11/70 |
| 2021/0348055 A1 | 11/2021 | Kwon et al. | |
| 2021/0371744 A1 | 12/2021 | Nikata et al. | |

FOREIGN PATENT DOCUMENTS

| | | |
|---|---|---|
| KR | 20150034621 A | 4/2015 |
| KR | 1525524 B1 | 6/2015 |
| KR | 20160105460 A | 9/2016 |
| KR | 1020170022951 A | 3/2017 |
| KR | 1020170034055 A | 3/2017 |
| KR | 1020170048220 A | 5/2017 |
| KR | 20170074585 A | 6/2017 |
| KR | 20180013801 A | 2/2018 |
| KR | 1020180043748 A | 4/2018 |
| KR | 20180052170 A | 5/2018 |
| KR | 1020180058208 A | 5/2018 |
| KR | 1020180081002 A | 7/2018 |
| KR | 1020180096535 A | 8/2018 |

OTHER PUBLICATIONS

Eunbyul Bang et al., "Large-Scale Synthesis of Highly Luminescent InP@ZnS Quantum Dots Using Elemental Phosphorus Precursor," Chemistry of Materials, Apr. 24, 2017, pp. 4236-4243, vol. 29.

Extended European Search Report dated Apr. 14, 2020, of the corresponding European Patent Application No. 19212179.6.

Francesca Pietra et al., "Tuning the Lattice Parameter of InxZnyP for Highly Luminescent Lattice-Matched Core/Shell Quantum Dots," ACS NANO, Apr. 11, 2016, pp. 4754-4762 (A-I), vol. 10, Issue No. 4.

Haitao Liu et al., "Mechanistic Study of Precursor Evolution in Colloidal Group II-VI Semiconductor Nanocrystal Synthesis," J. Am. Chem. Soc., 2007, pp. 305-312, vol. 129, No. 2.

Lin Song Li et al., "High Quality ZnSe and ZnS Nanocrystals Formed by Activating Zinc Carboxylate Precursors," NANO Letters, 2004, pp. 2261-2264, vol. 4, No. 11.

Parthiban Ramasamy et al., "Tunable, Bright, and Narrow-Band Luminescence from Colloidal Indium Phosphide Quantum Dots," Chemistry of Materials, Aug. 4, 2017, pp. 6893-6899, vol. 29.

Parthiban Ramasamy et al., "Two-Step "Seed-Mediated" Synthetic Approach to Colloidal Indium Phosphide Quantum Dots with High-Purity Photo- and Electroluminescence," Chemistry of Materials, May 25, 2018, pp. 3643-3647, vol. 30.

Rita Choudhury et al., "Structural and optical characterization of undoped and doped ZnS (with Al & Ni) Nano particles," Int. Journal of Applied Sciences and Engineering Research, Jun. 2014, pp. 712-722, vol. 3, Issue 3.

\* cited by examiner

Pattern Preparation by using a photoresist

Repeating the Patterning Process three times

# QUANTUM DOTS AND DEVICES INCLUDING THE SAME

CROSS-REFERENCE TO RELATED APPLICATIONS

This application is a divisional application of application Ser. No. 16/697,650, filed on Nov. 27, 2019, which claims priority to and the benefit of Korean Patent Application No. 10-2018-0151184 filed in the Korean Intellectual Property Office on Nov. 29, 2018, and all the benefits accruing therefrom under 35 U.S.C. § 119, the entire contents of which are incorporated herein by reference.

BACKGROUND

1. Field

Quantum dots and devices including the same are disclosed.

2. Description of the Related Art

Physical characteristics (e.g., energy bandgaps, melting points, etc.) of nanoparticles that are intrinsic characteristics may be controlled by changing their particle sizes, unlike bulk materials. For example, semiconductor nanocrystals, also referred to as quantum dots, are a semiconductor material having a nano-sized crystal structure. The quantum dots have a large surface area per unit volume due to very small particle sizes and exhibit quantum confinement effects, and thus have different physicochemical characteristics from the characteristics of the bulk material having the same composition.

SUMMARY

An embodiment provides a quantum dot (e.g., an environmentally-friendly quantum dot) having improved photoluminescence characteristics and thermal stability.

An embodiment provides a method of producing the quantum dot.

An embodiment provides a pattern or a composite including the quantum dot.

An embodiment provides an electronic device including the quantum dot.

In an embodiment, a quantum dot includes a core and a shell disposed on the core,
  wherein one of the core and the shell includes a first semiconductor nanocrystal including zinc and sulfur and the other of the core and the shell includes a second semiconductor nanocrystal having a different composition from the first semiconductor nanocrystal,
  the first semiconductor nanocrystal further includes a metal and a halogen, the metal and the halogen being configured to act as a Lewis acid in a halide form,
  an amount of the metal is greater than or equal to about 10 mole percent (mol %), based on a total number of moles of sulfur, and
  an amount of the halogen is greater than or equal to about 10 mol %, based on a total number of moles of sulfur.

The first semiconductor nanocrystal may not include selenium.

The first semiconductor nanocrystal may include zinc sulfide.

The second semiconductor nanocrystal may include a Group II-VI compound, a Group III-V compound, a Group IV-VI compound, a Group IV element or compound, a Group compound, a Group I-II-IV-VI compound, or a combination thereof.

The second semiconductor nanocrystal may include InP, InZnP, ZnSe, ZnTeSe, ZnSeS, or a combination thereof.

The quantum dot may not include cadmium.

The first semiconductor nanocrystal may be present in the core.

The first semiconductor nanocrystal may be present in the shell.

The metal may include aluminum, magnesium, gallium, antimony, titanium, or a combination thereof.

The metal may include aluminum.

The halogen may include chlorine. The halogen may not include fluorine, iodine, bromine, or a combination thereof. The halogen may not include fluorine, iodine, and bromine.

The amount of the metal may be greater than or equal to about 15 mol %, based on a total number of moles of sulfur.

The amount of the metal may be greater than or equal to about 20 mol %, based on a total number of moles of sulfur.

The amount of the halogen may be greater than or equal to about 15 mol %, based on a total number of moles of sulfur.

The amount of the halogen may be greater than or equal to about 25 mol %, based on a total number of moles of sulfur.

The amount of the metal may be greater than or equal to about 6 mol %, based on a total number of moles of zinc.

The amount of the halogen may be greater than or equal to about 8 mol %, based on a total number of moles of zinc.

An X-ray diffraction spectrum of the quantum dot may exhibit a peak of the first semiconductor nanocrystal.

An X-ray diffraction spectrum of the quantum dot may not exhibit a peak of the compound composed of the metal and the halogen.

The shell may include a multi-layered shell including two or more layers wherein adjacent layers may have different compositions.

The multi-layered shell may include a first layer disposed directly on the core, the first layer including a third semiconductor nanocrystal; and a second layer disposed on the first layer, the second layer including the first semiconductor nanocrystal.

The third semiconductor nanocrystal may have a different composition from the first semiconductor nanocrystal.

The third semiconductor nanocrystal may include zinc and selenium.

The second layer may be an outermost layer.

The second semiconductor nanocrystal may include indium and phosphorus and a mole ratio of zinc relative to indium may be less than or equal to about 40:1.

The quantum dot may further include selenium. In an embodiment, the quantum dot may have a mole ratio of sulfur relative to selenium that is less than or equal to about 2:1.

In an embodiment, the quantum dot may have a mole ratio of zinc relative to selenium and sulfur that is greater than or equal to about 1.1:1.

The quantum dot may further include $R_3PO$, RCOOH, RCOOCOR, or a combination thereof on a surface of the quantum dot, wherein R is the same or different and is a substituted or unsubstituted C1 to C40 aliphatic hydrocarbon group, a substituted or unsubstituted C6 to C40 aromatic hydrocarbon group, or a combination thereof.

In an embodiment, a method of producing the aforementioned quantum dot includes:
preparing a zinc precursor not including a halogen;
reacting a Lewis base (e.g., $R_3P$ or $R_3PO$) (wherein, R is a substituted or unsubstituted C1 to C40 aliphatic hydrocarbon group, a substituted or unsubstituted C6 to C40 aromatic hydrocarbon group, or a combination thereof) with sulfur to prepare a sulfur precursor;
reacting a Lewis acid metal halide including the metal with the Lewis base to obtain an acid base adduct including the metal and halogen; and
optionally, in the presence of the core or a semiconductor nanocrystal particle including the core, reacting the zinc precursor and the sulfur precursor in the presence of the acid base adduct and a zinc halide to form a first semiconductor nanocrystal including zinc and sulfur and produce the quantum dot.

The zinc precursor may include a reaction product of a zinc compound and fatty acid.

The Lewis acid metal halide may include aluminum halide, magnesium halide, gallium halide, antimony halide, titanium halide, or a combination thereof.

The Lewis base may include $R_3P$, $R_3PO$, (wherein, R is a substituted or unsubstituted C1 to C40 aliphatic hydrocarbon group, a substituted or unsubstituted C6 to C40 aromatic hydrocarbon group, or a combination thereof), or a combination thereof.

A molar amount of the Lewis acid metal halide may be greater than or equal to about 10% and less than or equal to about 100%, based on a total number of moles of the sulfur precursor.

A molar amount of the zinc halide may be about 10% to about 100%, based on a total number of moles of the sulfur precursor.

In an embodiment, a quantum dot-polymer composite includes a polymer matrix and the aforementioned quantum dot in the polymer matrix.

The polymer matrix may include a linear polymer, a cross-linked polymer, or a combination thereof.

The polymer matrix may include a binder polymer including a carboxylic acid group.

The binder polymer including the carboxylic acid group may include
a copolymer of a monomer combination including a first monomer including the carboxylic acid group and a carbon-carbon double bond, a second monomer including a carbon-carbon double bond and a hydrophobic moiety and not including the carboxylic acid group and optionally a third monomer including a carbon-carbon double bond and a hydrophilic moiety and not including the carboxylic acid group;
a multiple aromatic ring-containing polymer having a backbone structure in which two aromatic rings are bound to a quaternary carbon atom that is a constituent atom of another cyclic moiety in a main chain of the backbone structure, the multiple aromatic ring-containing polymer including the carboxylic acid group (—COOH); or
a combination thereof.

The polymer matrix may include a polymerization product of a monomer combination including a thiol compound including at least one thiol group at a terminal end of the thiol compound and an ene compound including a carbon-carbon unsaturated bond, a metal oxide particulate, or a combination thereof.

The quantum dot-polymer composite may be in a form of a patterned film.

The quantum dot-polymer composite may be in a form of a film having a thickness of 10 micrometers (μm) and an absorption of blue light having a wavelength of 450 nm of greater than or equal to about 82% when an amount of the quantum dot is less than or equal to about 45 weight percent, based on a total weight of the quantum dot-polymer composite.

In an embodiment, a display device includes
a light source and a photoluminescence element,
wherein the photoluminescence element includes the aforementioned quantum dot-polymer composite, and
the light source is configured to provide the photoluminescence element with incident light.

The incident light may have a (luminescence) peak wavelength of about 440 nm to about 460 nm.

The photoluminescence element may include a sheet of the quantum dot-polymer composite.

The photoluminescence element may be a stack structure including a substrate and a light emission layer disposed on the substrate, wherein the light emission layer may include a pattern of the quantum dot-polymer composite.

The pattern may include at least one repeating section configured to emit light at a predetermined wavelength.

The pattern may include a first repeating section configured to emit a first light and a second repeating section configured to emit a second light having a different center wavelength from the first light.

The quantum dot according to an embodiment may exhibit improved photoluminescence characteristics. The quantum dot may exhibit improved thermal stability. The quantum dot according to an embodiment, when included in a quantum dot-based photoluminescent color filter (QD-CF), may minimize reduction of photoluminescence properties caused by medium mixing various processes in the manufacturing process, or a combination thereof, and thus may provide a device having improved properties. The quantum dot according to an embodiment may be applicable to, e.g., used in, a variety of light emitting devices and may be included in a display device having a excitation light (e.g., blue excitation light) (such as a liquid crystal display, a display device including an (blue light emitting) OLED as a light source, or a device including a photoluminescent color filter disposed on the blue light emitting micro LED) (e.g., as a photoluminescent color filter element). Such a light emitting device may be usefully used in a television (TV), a monitor, a mobile device, a virtual reality/augmented reality (VR/AR) device, a vehicle display, and the like.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
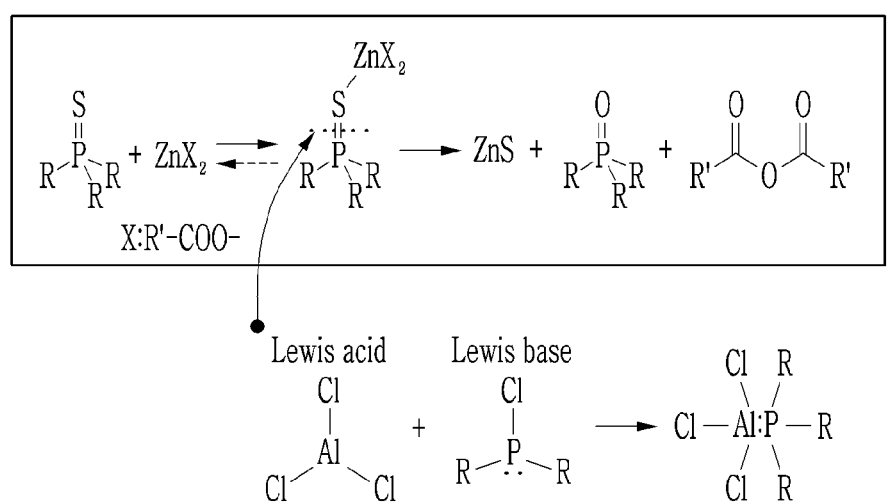
FIG. 1 is a view showing a reaction mechanism in a method of producing a quantum dot according to an embodiment.

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising", will be understood to imply the inclusion of stated elements but not the exclusion of any other elements.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Further, the singular includes the plural unless mentioned otherwise. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise.

It will be understood that, although the terms "first," "second," "third" etc. may be used herein to describe various elements, components, regions, layers and/or sections, these elements, components, regions, layers, and/or sections should not be limited by these terms. These terms are only used to distinguish one element, component, region, layer, or section from another element, component, region, layer, or section. Thus, "a first element," "component," "region," "layer", or "section" discussed below could be termed a second element, component, region, layer or section without departing from the teachings herein.

The terminology used herein is for the purpose of describing particular embodiments only and is not intended to be limiting. "At least one" is not to be construed as limiting "a" or "an." "Or" means "and/or." As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can, therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, unless otherwise described, the term "metal" includes metal elements and semi-metal elements (Si, B, etc.).

As used herein, unless otherwise described, "alkyl" refers to a linear or branched saturated monovalent hydrocarbon group (e.g., methyl, hexyl, etc.).

As used herein, unless otherwise described, "alkenyl" refers to a linear or branched monovalent hydrocarbon group having at least one carbon-carbon double bond.

As used herein, unless otherwise described, "aryl" refers to a monovalent hydrocarbon group formed by removing one hydrogen atom from at least one aromatic ring (e.g., phenyl or naphthyl).

As used herein, unless otherwise described, "substituted" refers to replacement of hydrogen of a compound by a substituent selected from a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, halogen (—F, —Cl, —Br or —I), a hydroxy group (—OH), a nitro group (—NO$_2$), a cyano group (—CN), an amino or amine group (—NRR' wherein R and R' are each independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), and a combination thereof.

As used herein, unless otherwise described, "monovalent hydrocarbon group" refers to a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, or a C2 to C30 heterocycloalkyl group.

As used herein, unless otherwise described, "hetero" refers to inclusion of at least one to three heteroatoms selected from N, O, S, Si, and P.

As used herein, unless otherwise described, "alkylene group" refers to a straight or branched saturated aliphatic hydrocarbon group having at least two valences and optionally substituted with at least one substituent. As used herein, "arylene group" refers to a functional group having at least two valences obtained by removal of at least two hydrogens in at least one aromatic ring, and optionally substituted with at least one substituent.

As used herein, unless otherwise described, "aliphatic" refers to a C1 to C30 linear or branched alkyl group, a C2 to C30 linear or branched alkenyl group, or a C2 to C30 linear or branched alkynyl group.

As used herein, unless otherwise described, "aromatic" refers to a C6 to C30 aryl group or a C2 to C30 heteroaryl group.

As used herein, unless otherwise described, "alicyclic" refers to a C3 to C30 cycloalkyl group, a C3 to C30 cycloalkenyl group, or a C3 to C30 cycloalkynyl group.

As used herein, unless otherwise described, "(meth)acrylate" refers to acrylate, methacrylate, or a combination thereof. The (meth)acrylate may include a (C1 to 010 alkyl)acrylate, a (C1 to C10 alkyl)methacrylate, or a combination thereof.

As used herein, unless otherwise described, "alkoxy" refers to alkyl group that is linked via an oxygen (i.e., alkyl-O—), for example methoxy, ethoxy, and sec-butyloxy groups.

As used herein, unless otherwise described, "alkynyl" refers to a straight or branched chain, monovalent hydrocarbon group having at least one carbon-carbon triple bond (e.g., ethynyl).

As used herein, unless otherwise described, "amine or amino group" refers to a group having the general formula —NRR, wherein each R is independently hydrogen(amino group, when two R are each hydrogen), a C1-C12 alkyl group, a C7-C20 alkylarylene group, a C7-C20 arylalkylene group, or a C6-C18 aryl group.

As used herein, unless otherwise described, "arene" refers to a hydrocarbon having an aromatic ring, and includes monocyclic and polycyclic hydrocarbons wherein the additional ring(s) of the polycyclic hydrocarbon may be aromatic or nonaromatic. Specific arenes include benzene, naphthalene, toluene, and xylene.

As used herein, unless otherwise described, "arylalkyl" refers to a substituted or unsubstituted aryl group covalently linked to an alkyl group that is linked to a compound (e.g., a benzyl is a C7 arylalkyl group).

As used herein, unless otherwise described, "cycloalkenyl" refers to a monovalent hydrocarbon group having one or more rings and one or more carbon-carbon double bond in the ring, wherein all ring members are carbon (e.g., cyclopentyl and cyclohexyl).

As used herein, unless otherwise described, "cycloalkyl" refers to a monovalent hydrocarbon group having one or more saturated rings in which all ring members are carbon (e.g., cyclopentyl and cyclohexyl).

As used herein, unless otherwise described, "cycloalkynyl" refers to a stable aliphatic monocyclic or polycyclic group having at least one carbon-carbon triple bond, wherein all ring members are carbon (e.g., cyclohexenyl).

As used herein, unless otherwise described, "ester group" refers to a group of the formula —O(C=O)Rx or a group of the formula —(C=O)ORx. In an embodiment, Rx may be C1 to C28 aromatic organic group or aliphatic organic group. An ester group may include a C2 to C30 ester group, and specifically a C2 to C18 ester group.

As used herein, unless otherwise described, "heteroalkyl" refers to alkyl group that comprises at least one heteroatom covalently bonded to one or more carbon atoms of the alkyl group. Each heteroatom is independently chosen from nitrogen (N), oxygen (O), sulfur (S), and or phosphorus (P).

As used herein, unless otherwise described, "ketone" refers to a (e.g., C2 to C30) ketone group, and specifically a (e.g., C2 to C18) ketone group. Ketone groups have the indicated number of carbon atoms, with the carbon of the keto group being included in the numbered carbon atoms. For example, a C2 ketone group is an acetyl group having the formula CH$_3$(C=O)—.

As used herein, "Group" refers to a group of Periodic Table.

As used herein, "Group I" refers to Group IA and Group IB, and examples may include Li, Na, K, Rb, and Cs, but are not limited thereto.

As used herein, "Group II" refers to Group IIA and Group IIB, and examples of Group II metal may be Cd, Zn, Hg, and Mg, but are not limited thereto.

As used herein, "Group III" refers to Group IIIA and Group IIIB, and examples of Group III metal may be Al, In, Ga, and TI, but are not limited thereto.

As used herein, "Group IV" refers to Group IVA and Group IVB, and examples of a Group IV metal may be Si, Ge, and Sn, but are not limited thereto.

Quantum dots may absorb light from an excitation source, may be transitioned to an energy excitation state, and emit energy corresponding to energy bandgap of the quantum dots. Energy bandgap of quantum dots may be controlled by adjusting a size and a composition of nanocrystal. Quantum dots may be employed for, e.g., used in, various fields such as a display device, an energy device, or a bio luminescence device, and the like and may improve color purity. When being applied to, e.g., used in, an actual device, quantum dots may be provided in a form of being arranged as a pattern, e.g., may be arranged in a pattern, (e.g., photoluminescent color filter), in a form of being dispersed in the various media (e.g., organic/inorganic polymer, etc.), or a combination thereof.

For a quantum dot having a core-shell structure, a shell surface passivation may provide a somewhat increased luminous efficiency. However, quantum dots may have a core including cadmium. Since cadmium is an environmentally harmful component, quantum dots which may exhibit improved photoluminescence properties without cadmium are desirable. For example, cadmium-free quantum dots in which a shell (e.g., multi-layered shell of zinc chalcogenide) is disposed on Group III-V compound (e.g., InP)-based semiconductor nanocrystal core (hereinafter, abbreviated as InP/ZnSeS quantum dots) may improve luminous efficiency. Despite a high initial efficiency thereof, the InP/ZnSeS quantum dots may suffer a decrease in a luminous efficiency when the InP/ZnSeS quantum dots are prepared in a form that is to be employed in the actual device (e.g., a pattern, a polymer composite, or a combination thereof). The present inventors have found that when InP/ZnSeS quantum dots (e.g., including a photocurable component) having an initial efficiency of 60% to 90% go through a process of mixing with medium (e.g., including photocurable component), a subsequent process (e.g., heat treatment at a high temperature), or a combination thereof and thereby is formed in a photoluminescent color filter, a resulting color filter tends to exhibit a decreased efficiency in comparison with the initial luminous efficiency of the quantum dots.

Without being bound by a theory, it is believed that such a decrease in the efficiency indicates insufficient energy segregation between the excited electrons/holes generated in the core of the quantum dots and the surfaces of the quantum dots. Accordingly, when damage to the ligands on the surfaces of the quantum dots (QDs) by a medium (e.g., polymer), a heat treatment, or a combination thereof occurs, damaged regions may act as a trap that provides nonradiative recombination.

While it is believed that a sufficient increase in a thickness of the shell (e.g., ZnSe and ZnS) may bring forth, e.g., provide, separation between the electron/holes in the quantum dot core and the surface of the quantum dot, the increased thickness of the shell layer may also lead to a sharp increase in a quantum dot weight. For example, a slight increase in a thickness of an outermost layer (e.g., ZnS layer) of the shell may cause an increase in a total weight of the quantum dot. The weight increase may result in a substantial reduction of the number of quantum dots included in a given weight, leading to a decrease of a light absorption. As the photo-luminescent color filter may tend to be disposed in a front side of the device, the decrease of the light absorption may deteriorate a luminous efficiency and may have adverse effects on color reproducibility of a display device. Therefore, desired is a technology that can minimize a decrease in the quantum efficiency caused by contact with a medium, heat treatment, or a combination thereof while light absorption is maintained at a desired level.

The quantum dot according to an embodiment achieves the aforementioned technical object by having the features described below. The quantum dot according to an embodiment includes a core and a shell disposed on the core, wherein one of the core and the shell includes a first semiconductor nanocrystal including zinc and sulfur and the other includes a second semiconductor nanocrystal having a different composition from the first semiconductor nanocrystal, the first semiconductor nanocrystal further includes a metal and a halogen that are configured to act as a Lewis acid in a halide form, an amount of the metal is greater than or equal to about 10 mol %, for example greater than or equal to about 15 mol %, or greater than or equal to about 20 mol %, based on a total number of moles of sulfur, and an amount of the halogen is greater than or equal to about 10 mol %, for example, greater than or equal to about 15 mol %, or greater than or equal to about 20 mol %, based on a total number of moles of sulfur. Herein mol % means a percentage based on the total number of moles.

In an embodiment, the quantum dot does not include cadmium. In an embodiment, the quantum dot does not include (restricted and/or toxic) heavy metals (e.g., cadmium, lead, mercury, or a combination thereof).

The first semiconductor nanocrystal may include a metal chalcogenide including a Group II metal (e.g., zinc). In an embodiment, the metal chalcogenide may include zinc chalcogenide. In an embodiment, the first semiconductor nanocrystal does not include selenium. The first semiconductor nanocrystal may include zinc sulfide. The first semiconductor nanocrystal may include ZnS, ZnSeS, or a combination thereof.

The second semiconductor nanocrystal may include a Group II-VI compound, a Group III-V compound, a Group IV-VI compound, a Group IV element or compound, a Group compound, a Group I-II-IV-VI compound, or a combination thereof. In the quantum dots, the second semiconductor nanocrystal may be included in the core.

The Group II-VI compound may be a binary element compound of CdSe, CdTe, ZnS, ZnSe, ZnTe, ZnO, HgS, HgSe, HgTe, MgSe, MgS, or a combination thereof; a ternary element compound of CdSeS, CdSeTe, CdSTe, ZnSeS, ZnSeTe, ZnSTe, HgSeS, HgSeTe, HgSTe, HgZnS, HgZnSe, HgZnTe, MgZnSe, MgZnS, CdZnS, CdZnSe, CdZnTe, CdHgS, CdHgSe, CdHgTe, or a combination thereof; or a quaternary element compound of HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof, but is not limited thereto.

The Group III-V compound may be a binary element compound of GaN, GaP, GaAs, GaSb, AlN, AlP, AlAs, AlSb, InN, InP, InAs, InSb, or a combination thereof; a ternary element compound of GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; or a quaternary element compound of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof, but is not limited thereto. For example, the Group III-V compound may further include a Group II metal, like InZnP.

The Group IV-VI compound may be a binary element compound of SnS, SnSe, SnTe, PbS, PbSe, PbTe, or a combination thereof; a ternary element compound of SnSeS, SnSeTe, SnSTe, PbSeS, PbSeTe, PbSTe, SnPbS, SnPbSe, SnPbTe, or a combination thereof; or a quaternary element compound of SnPbSSe, SnPbSeTe, SnPbSTe, or a combination thereof, but is not limited thereto.

The Group compound may be $CuInSe_2$, $CuInS_2$, CuInGaSe, CuInGaS, or a combination thereof, but is not limited thereto.

The Group compound may be ZnGaS, ZnAlS, ZnInS, ZnGaSe, ZnAlSe, ZnInSe, ZnGaTe, ZnAlTe, ZnInTe, ZnGaO, ZnAlO, ZnInO, HgGaS, HgAlS, HgInS, HgGaSe, HgAlSe, HgInSe, HgGaTe, HgAlTe, HgInTe, MgGaS, MgAlS, MgInS, MgGaSe, MgAlSe, MgInSe, or a combination thereof, but is not limited thereto.

The Group I-II-IV-VI compound may be CuZnSnSe or CuZnSnS, but is not limited thereto.

The Group IV element or compound may be a single substance of Si, Ge, or a combination thereof; or a binary element compound of SiC, SiGe, or a combination thereof, but is not limited thereto.

In a quantum dot of an embodiment, the second semiconductor nanocrystal may include a Group III-V compound. The second semiconductor nanocrystal may include InP, InZnP, or a combination thereof.

In a quantum dot of an embodiment, the core may include the second semiconductor nanocrystal and the shell may include the first semiconductor nanocrystal. In a quantum dot of an embodiment, the core may include the first semiconductor nanocrystal and the shell may include the second semiconductor nanocrystal.

In a quantum dot of an embodiment, the core may include an indium phosphide compound (e.g., InP or InZnP). In a quantum dot of an embodiment, the shell may include a zinc sulfide compound (e.g., ZnS or ZnSeS).

In a quantum dot of an embodiment, the first semiconductor nanocrystal (or the shell including the first semiconductor nanocrystal) may include a metal and a halogen that are configured to act as a Lewis acid in a halide form (e.g., at increased amount). In the quantum dot, an amount of the metal may be greater than or equal to about 10 mol %, for example, greater than or equal to about 15 mol %, or greater than or equal to about 20 mol %, based on a total number of moles of sulfur.

An amount of the halogen may be greater than or equal to about 10 mol %, for example, greater than or equal to about 15 mol %, or greater than or equal to about 20 mol %, based on a total number of moles of sulfur.

The X-ray diffraction spectrum of the quantum dot may not exhibit a peak of a compound including the metal and the halogen (e.g., a metal halide compound consisting of the Lewis metal and the halogen). The X-ray diffraction spectrum of the quantum dot may not exhibit a peak due to a presence of the metal. The X-ray diffraction spectrum of the quantum dot may not exhibit a peak due to the presence of the halogen. In an embodiment, the metal and the halogen may be present on the surface of the first semiconductor nanocrystal. The X-ray diffraction spectrum of the quantum dot may exhibit a zinc blend structure.

By the inclusion of the aforementioned amounts of the metal and the halogen in the first semiconductor nanocrystal or on the surface thereof, the quantum dot according to an embodiment may exhibit improved stability (e.g., chemical stability, thermal stability, or a combination thereof) with a shell that is not thick, and accordingly, the quantum dot may maintain improved photoluminescence characteristics when the quantum dot undergoes a contact with, e.g., contract, the medium, a heat treatment during forming a pattern or a composite, or a combination thereof and at the same time, the quantum dot may exhibit improved excitation light absorption per unit weight. Without being bound by any theory, for example, it is believed that in case of the quantum dot having (e.g., a shell of) the first semiconductor nanocrystal including the aforementioned amounts of metal and halogen, the metal and the halogen may further passivate the surface of the quantum dot in addition to (or in exchange for) the organic ligand present on a surface thereof (or by exchanging the same), and such an effect of the passivation may improve a chemical stability, electrical stability, or a combination thereof of the quantum dots. The quantum dots of an embodiment with having such enhanced stability may not undergo (or exhibit a limited or suppressed level of) luminous efficiency deterioration (e.g., when the quantum dots are in contact with a polymer medium and subject to heat-treating), thus a polymer composite or a pattern including the same may achieve enhanced luminous efficiency. In an embodiment, the metal and the halogen may passivate the outermost layer of the quantum dot (by a Z-type ligand exchange).

The metal may include aluminum, magnesium, gallium, antimony, titanium, or a combination thereof. The metal may include aluminum.

The halogen may include chlorine. In an embodiment, the halogen does not include fluorine, iodine, bromine, or a combination thereof. In an embodiment, the halogen does not include fluorine, iodine, and bromine.

In the quantum dot, an amount of the metal may be greater than or equal to about 10 mol %, greater than or equal to about 11 mol %, greater than or equal to about 12 mol %, greater than or equal to about 13 mol %, greater than or equal to about 14 mol %, greater than or equal to about 15 mol %, greater than or equal to about 16 mol %, greater than or equal to about 17 mol %, greater than or equal to about 18 mol %, greater than or equal to about 19 mol %, greater than or equal to about 20 mol %, greater than or equal to about 21 mol %, greater than or equal to about 22 mol %, greater than or equal to about 23 mol %, greater than or equal to about 24 mol %, greater than or equal to about 25 mol %, or greater than or equal to about 26 mol %, based on a total number of moles of sulfur. The amount of the metal may be less than or equal to about 50 mol %, for example, less than or equal to about 45 mol %, less than or equal to about 40 mol %, less than or equal to about 35 mol %, or less than or equal to about 30 mol %, based on a total number of moles of sulfur.

In the quantum dot, an amount of the halogen may be greater than or equal to about 10 mol %, greater than or equal to about 11 mol %, greater than or equal to about 12 mol %, greater than or equal to about 13 mol %, greater than or equal to about 14 mol %, greater than or equal to about 15 mol %, greater than or equal to about 16 mol %, greater than or equal to about 17 mol %, greater than or equal to about 18 mol %, greater than or equal to about 19 mol %, greater than or equal to about 20 mol %, greater than or equal to about 21 mol %, greater than or equal to about 22 mol %, greater than or equal to about 23 mol %, greater than or equal to about 24 mol %, greater than or equal to about 25 mol %, or greater than or equal to about 26 mol %, based on a total number of moles of sulfur. The amount of the halogen may be less than or equal to about 70 mol %, for example, less than or equal to about 65 mol %, less than or equal to about 60 mol %, less than or equal to about 55 mol %, or less than or equal to about 50 mol %, based on a total number of moles of sulfur.

An amount of the metal may be greater than or equal to about 5 mol %, for example, greater than or equal to about 5.5 mol %, greater than or equal to about 5.6 mol %, greater than or equal to about 5.7 mol %, greater than or equal to about 5.8 mol %, greater than or equal to about 5.9 mol %, greater than or equal to about 6.0 mol %, greater than or equal to about 6.1 mol %, greater than or equal to about 6.2 mol %, greater than or equal to about 6.3 mol %, greater than or equal to about 6.4 mol %, greater than or equal to about 6.5 mol %, greater than or equal to about 6.6 mol %, greater than or equal to about 6.7 mol %, greater than or equal to about 6.8 mol %, greater than or equal to about 6.9 mol %, greater than or equal to about 7 mol %, greater than or equal to about 7.1 mol %, greater than or equal to about 7.2 mol %, greater than or equal to about 7.3 mol %, greater than or equal to about 7.4 mol %, greater than or equal to about 7.5 mol %, greater than or equal to about 7.6 mol %, greater than or equal to about 7.7 mol %, greater than or equal to about 7.8 mol %, greater than or equal to about 7.9 mol %, or greater than or equal to about 8 mol %, based on a total number of moles of zinc. The amount of the metal may be less than or equal to about 20 mol %, for example, less than or equal to about 15 mol %, less than or equal to about 14 mol %, less than or equal to about 13 mol %, less than or equal to about 12 mol %, less than or equal to about 11 mol %, or less than or equal to about 10 mol %, based on a total number of moles of zinc.

An amount of the halogen may be greater than or equal to about 8 mol %, for example, greater than or equal to about 8.5 mol %, greater than or equal to about 9 mol %, greater than or equal to about 9.5 mol %, greater than or equal to about 10 mol %, greater than or equal to about 10.5 mol %, greater than or equal to about 11 mol %, greater than or equal to about 11.5 mol %, greater than or equal to about 12 mol %, greater than or equal to about 12.5 mol %, greater than or equal to about 13 mol %, greater than or equal to about 13.5 mol %, or greater than or equal to about 14 mol %, based on a total number of moles of zinc. The amount of the halogen may be less than or equal to about 30 mol %, for example less than or equal to about 25 mol %, less than or equal to about 20 mol %, less than or equal to about 19 mol %, less than or equal to about 18 mol %, or less than or equal to about 17 mol %, based on a total number of moles of zinc.

A quantum dot including a first semiconductor nanocrystal including the aforementioned contents of metal and halogen may be produced by a method that will be described below.

The shell may include a multi-layered shell including at least two layers wherein the adjacent layers may have different compositions. In an embodiment, the multi-layered shell may have at least two layers, for example, two, three, four, five, or more layers. The two adjacent layers of the shell may have different compositions. In the multi-layered shell, each layer may have a composition that varies along the radius.

In an embodiment, the first semiconductor nanocrystal may be included in the shell, the shell may have a multi-layered shell structure, and the multi-layered shell may include a first layer disposed directly on the core and including a third semiconductor nanocrystal and a second layer disposed on (or directly on) the first layer and including the first semiconductor nanocrystal.

The third semiconductor nanocrystal may have a different composition from the first semiconductor nanocrystal. The third semiconductor nanocrystal may include a Group II-VI compound, a Group III-V compound, a Group IV-VI compound, a Group IV element or compound, a Group compound, a Group I-II-IV-VI compound, or a combination thereof. An example of each compound is described above.

The third semiconductor nanocrystal may include a zinc chalcogenide. The third semiconductor nanocrystal may include ZnSe, ZnSeS, ZnS, or a combination thereof. In an embodiment, the third semiconductor nanocrystal does not include sulfur.

The second layer may be the outermost layer. The thickness of the first layer may be about 1 monolayer (ML) of the third semiconductor nanocrystal, for example, about 2 ML or more, about 3 ML or more, about 4 ML or more, or about 5 ML or more and about 10 ML or less, about 9 ML or less, or about 8 ML or less. The thickness of the second layer may be about 1 monolayer of the first semiconductor nanocrystal, for example, about 2 ML or more, about 3 ML or more, about 4 ML or more, or about 5 ML or more and about 10 ML or less about 9 ML or less, about 8 ML or less, about 7 ML or less, about 6 ML or less, about 5 ML or less, or about 4 ML or less.

The energy bandgap of the third semiconductor nanocrystal may be larger than the energy bandgap of the material included the core (e.g., second semiconductor nanocrystal) and may be less than the energy bandgap of the first semiconductor nanocrystal.

In an embodiment, the core may include the second semiconductor nanocrystal, the second semiconductor nanocrystal may include indium and indium and phosphorus. In an embodiment, a mole ratio of zinc relative to indium may be less than or equal to about 40:1, less than or equal to about 38:1, less than or equal to about 36:1, less than or equal to about 34:1, or less than or equal to about 33:1. In an embodiment, a mole ratio of zinc relative to indium may be greater than or equal to about 20:1, greater than or equal to about 22:1, greater than or equal to about 24:1, greater than or equal to about 26:1, greater than or equal to about 28:1, greater than or equal to about 30:1, or greater than or equal to about 31:1.

The quantum dot may further include selenium (in the core or the shell). In this case, in the quantum dot, a mole ratio of sulfur relative to selenium may be less than or equal to about 2:1. A mole ratio of zinc relative to selenium and sulfur may be greater than or equal to about 1.1:1, or greater than or equal to about 1.2:1 and less than or equal to about 2:1 or less than or equal to about 1.5:1.

The (non-cadmium) quantum dot according to an embodiment may exhibit improved luminous efficiency due to the aforementioned structure. For example, the quantum dot may have a full width at half maximum (FWHM) of less than or equal to about 45 nm, less than or equal to about 42 nm, less than or equal to about 41 nm, less than or equal to about 40 nm, or less than or equal to about 39 nm. The quantum dot may have a quantum yield of greater than or equal to about 70%, for example, greater than or equal to about 75%, greater than or equal to about 76%, greater than or equal to about 77%, greater than or equal to about 78%, or greater than or equal to about 79%.

The quantum dot may absorb light (hereinafter, excitation light) in a predetermined wavelength (e.g., such as a wavelength of greater than or equal to about 300 nm, greater than or equal to about 350 nm, greater than or equal to about 400 nm, greater than or equal to about 440 nm, or greater than or equal to about 450 nm and less than or equal to about 700 nm, less than or equal to about 600 nm, less than or equal to about 500 nm, less than or equal to about 490 nm, less than or equal to about 480 nm, less than or equal to about 470 nm, or less than or equal to about 465 nm, and may emit light in a longer wavelength than the wavelength of the excitation light. A wavelength of the emitted light (e.g., the center wavelength of the maximum peak) may be controlled by adjusting a size and a composition of the quantum dot. The wavelength of the emitted light may be in the range of about 500 nm to about 700 nm, for example, about 500 nm to about 560 nm or about 600 to about 650 nm, but is not limited thereto.

The quantum dot may have a particle size (e.g., a particle diameter or in case of a non-spherical shape, an equivalent diameter that is calculated from a two dimensional image obtained from an electron microscopic analysis of a quantum dot) of greater than or equal to about 1 nm and less than or equal to about 100 nm.

As used herein, a value regarding the size (e.g., a diameter or the like) may represent an average value.

The quantum dot may have a size (e.g., an average size) of about 1 nm to about 50 nm, for example, greater than or equal to about 2 nm, greater than or equal to about 3 nm, greater than or equal to about 4 nm, greater than or equal to about 5 nm, greater than or equal to about 6 nm, greater than or equal to about 7 nm, greater than or equal to about 8 nm, or greater than or equal to about 9 nm and less than or equal to about 50 nm, less than or equal to about 40 nm, less than or equal to about 30 nm, less than or equal to about 29 nm, less than or equal to about 28 nm, less than or equal to about 27 nm, less than or equal to about 26 nm, less than or equal to about 25 nm, less than or equal to about 24 nm, less than or equal to about 23 nm, less than or equal to about 21 nm, less than or equal to about 20 nm, less than or equal to about 19 nm, less than or equal to about 18 nm, less than or equal to about 17 nm, less than or equal to about 16 nm, or less than or equal to about 15 nm. A shape of the quantum dot is not particularly limited. For example, the shape of the quantum dot may be a sphere, a polyhedron, a pyramid, a multipod, a cube, a rectangular parallelepiped, a nanotube, a nanorod, a nanowire, a nanosheet, or a combination thereof, but is not limited thereto.

The presence and contents of the metal and the halogen included in the quantum dot may be measured by photoelectron spectroscopy (X-ray photoelectron spectroscopy, XPS), inductively coupled plasma-atomic emission spectroscopy (ICP-AES), ion chromatography, Rutherford backscattering spectroscopy (RBS), and time-of-flight secondary ion mass spectrometry (TOFSIMS) but are not limited thereto.

The quantum dot may include an organic ligand on its surface. The organic ligand may be bound to a surface of the quantum dot. The organic ligand may have a hydrophobic moiety. The organic ligand may be bound to a surface of a surface of the quantum dot. The organic ligand may include RCOOH, RSH, $RNH_2$, $R_2NH$, $R_3N$, $R_3PO$, $RH_2P$, $R_2HP$, $R_3P$, $RH_2PO$, $R_2HPO$, ROH, RC(=O)OR, RC(=O)OC(=O)R, $RPO(OH)_2$, RHPOOH, $R_2POOH$, or a combination thereof, wherein, each R is independently a C1 to C40 substituted or unsubstituted aliphatic hydrocarbon group such as a C3 to C40 alkyl or alkenyl, a C1 to C40 substituted or unsubstituted aromatic hydrocarbon group such as a C6 to C40 aryl group, or a combination thereof. The organic ligand may coordinate with, e.g., be bound to, the surface of the obtained nanocrystal and may aid with dispersibility of the nanocrystal in the solution, affect light emitting and electrical characteristics of the quantum dot, or a combination thereof. Examples of the organic ligand may include methane thiol, ethane thiol, propane thiol, butane thiol, pentane thiol, hexane thiol, octane thiol, dodecane thiol, hexadecane thiol, octadecane thiol, benzyl thiol; methane amine, ethane amine, propane amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine such as a substituted or unsubstituted methyl phosphine (e.g., trimethyl phosphine, methyldiphenyl phosphine, etc.), a substituted or unsubstituted ethyl phosphine (e.g., triethyl phosphine, ethyldiphenyl phosphine, etc.), a substituted or unsubstituted propyl phosphine, a substituted or unsubstituted butyl phosphine, a substituted or unsubstituted pentyl phosphine, or a substituted or unsubstituted octylphosphine (e.g., trioctylphosphine (TOP)); a phosphine oxide such as a substituted or unsubstituted methyl phosphine oxide (e.g., trimethyl phosphine oxide, methyldiphenyl phosphine oxide, etc.), a substituted or unsubstituted ethyl phosphine oxide (e.g., triethyl phosphine oxide, ethyldiphenyl phosphine oxide, etc.), a substituted or unsubstituted propyl phosphine oxide, a substituted or unsubstituted butyl phosphine oxide, or a substituted or unsubstituted octyl phosphine oxide (e.g., trioctylphosphine oxide (TOPO); a diphenyl phosphine compound, a triphenyl phosphine compound, or an oxide compound thereof; phosphonic acid such as a C5 to C20 alkyl phosphonic acid, and the like; a C5 to C20 alkylphosphinic acid such as hexylphosphinic acid, octylphosphinic acid, dodecanephosphinic acid, tetradecanephosphinic acid, hexadecanephosphinic acid, or octadecanephosphinic acid; and the like, but are not limited thereto. One or more organic ligands may be used.

In an embodiment, a method of producing the quantum dot having the aforementioned composition and structure may include preparing a zinc precursor not including a halogen;

reacting a Lewis base compound (e.g., $R_3P$ or $R_3PO$ (wherein, R is hydrogen or a substituted or unsubstituted C1 to C40 aliphatic hydrocarbon group, a substituted or unsubstituted C6 to C40 aromatic hydrocarbon group, or a combination thereof, provided that at least one of R is alkyl)) with sulfur to prepare a sulfur precursor;

reacting a Lewis acid metal halide including a metal with the Lewis base to obtain an acid base adduct including the metal and halogen; and optionally, in the presence of a core or a semiconductor nanocrystal particle including the core, reacting the zinc precursor and the sulfur precursor in the presence of the acid base adduct and a zinc halide to form a first semiconductor nanocrystal including zinc and sulfur.

When the quantum dot includes the first semiconductor nanocrystal in the shell, the first semiconductor nanocrystal is formed in the presence of the core or the core including the semiconductor nanocrystal particle.

The zinc precursor which does not include a halogen may include dimethyl zinc, diethyl zinc, zinc acetate, zinc acetylacetonate, zinc carbonate, zinc cyanide, zinc nitrate, zinc oxide, zinc peroxide, zinc sulfate, or a combination thereof. The zinc precursor may include a reaction product of a zinc compound (e.g., zinc acetate) and a fatty acid (e.g., a monocarboxylic acid having 10 or more carbon atoms such as stearic acid, oleic acid, palmitic acid, lauric acid, etc.). The reaction of the zinc compound and the fatty acid may proceed for a predetermined time at a temperature of greater than or equal to about 120° C. in an organic solvent.

The sulfur precursor may be obtained by contacting a sulfur compound with a compound which may act as a Lewis base (hereinafter, also referred to as Lewis base compound). The Lewis base compound may include primary, secondary, or tertiary phosphine or primary, secondary, or tertiary phosphine oxide. The Lewis base compound may include $R_3P$ or $R_3PO$ (wherein, R is hydrogen or a substituted or unsubstituted C1 to C40 aliphatic hydrocarbon group, a substituted or unsubstituted C6 to C40 aromatic hydrocarbon group, or a combination thereof), or a combination thereof. Herein, in the above chemical formula, R may include hydrogen, a substituted or unsubstituted C1 to C40 (e.g., C6 or more, C7 or more, C8 or more, C9 or more, or 010 or more and C40 or less, C30 or less, or C25 or less) aliphatic hydrocarbon group (e.g., alkyl, alkenyl, alkynyl), a substituted or unsubstituted C6 to C40 aromatic hydrocarbon group, or a combination thereof. The sulfur may include elemental sulfur. The contacting may include dispersing, stirring, or a combination thereof. The contacting may be performed at a temperature of greater than or equal to about 120° C., greater than or equal to about 130° C., greater than or equal to about 140° C., or greater than or equal to about 150° C. and less than or equal to about 340° C., for example, less than or equal to about 330° C., less than or equal to about 320° C., less than or equal to about 310° C., less than or equal to about 300° C., less than or equal to about 290° C., less than or equal to about 280° C., less than or equal to about 270° C., less than or equal to about 260° C., less than or equal to about 250° C., less than or equal to about 240° C., less than or equal to about 230° C., less than or equal to about 220° C., less than or equal to about 210° C., or less than or equal to about 200° C. Examples of the phosphine oxide may include trioctylphosphine oxide, triphenylphosphine oxide, diphenylphosphine oxide, or a combination thereof, but are not limited thereto. Examples of the phosphine may include trioctylphosphine, diphenylphosphine, or a combination thereof, but are not limited thereto.

The Lewis acid metal halide includes the aforementioned metal. The details for the metal are as described above. The Lewis acid metal halide may include aluminum halide, magnesium halide, gallium halide, antimony halide, titanium halide, or a combination thereof.

The Lewis base is a compound capable of providing an electron pair to the Lewis acid metal halide. In an embodiment, the Lewis base may include the same compound used to form the sulfur precursor. Details for the Lewis base are the same as those described in connection with the formation of the sulfur precursor. The Lewis base may include $R_3P$, $R_3PO$, or a combination thereof (wherein, R is hydrogen, a substituted or unsubstituted C1 to C40 (e.g., C6 or more, C7 or more, C8 or more, C9 or more, or 010 or more and C40 or less, C30 or less, or C25 or less) aliphatic hydrocarbon group (e.g., alkyl, alkenyl, alkynyl, etc.), a substituted or unsubstituted C6 to C40 aromatic hydrocarbon group, or a combination thereof).

The Lewis acid metal halide and the Lewis base react to form an acid base adduct. The reaction condition is not particularly limited and may be selected appropriately. The reaction temperature may be greater than or equal to about 30° C., for example, greater than or equal to about 40° C., greater than or equal to about 50° C., greater than or equal to about 60° C., greater than or equal to about 70° C., greater than or equal to about 80° C., greater than or equal to about 90° C., or greater than or equal to about 100° C. and less than or equal to about 300° C., less than or equal to about 200° C., less than or equal to about 150° C., less than or equal to about 140° C., less than or equal to about 130° C., less than or equal to about 120° C., or less than or equal to about 110° C.

The zinc precursor and the sulfur precursor react in the presence of acid base adduct and a zinc halide in an organic solvent to form the first semiconductor nanocrystal.

According to the method of an embodiment, during the synthesis of a first semiconductor nanocrystal including Zn and S from the Zn precursor and the S precursor, a metal-containing Lewis acid halide and a zinc halide are used together with the zinc precursor. The method may provide a ZnS layer (e.g., that provides good passivation on a shell or an outermost shell or having a defect-free surface). In addition, the method may make it possible for the first semiconductor nanocrystal to include the metal and the halogen in the aforementioned amount relative to sulfur or zinc.

Without being bound by any theory, a reaction of forming a zinc sulfide in the method according to an embodiment is described with reference to FIG. 1. The compounds shown in FIG. 1 are exemplified, but the present invention is not limited thereto. Without being bound by any theory, according to the reaction mechanism shown in FIG. 1, it is believed that the metal halide and zinc halide facilitate the reaction of the aforementioned zinc precursor and sulfur precursor to generate ZnS. For example, the Lewis acid metal halide (e.g., aluminum chloride) acts as Lewis acid material to withdraw electrons, and contributes to separating $R_3P$ from S in the sulfur precursor (e.g., $R_3P=S$). In addition, zinc halide (e.g., $ZnCl_2$) acts as Lewis acid contributing to separating S and also is a Zn precursor, so to provide a ZnS coating or particle having no defects. The ZnS nanocrystal prepared under the condition may include a metal (e.g., Al) and a halogen (e.g., Cl) within the aforementioned ranged amounts.

According to the aforementioned method, when the aforementioned reaction is performed under a, e.g., in the, presence of the core (e.g., indium phosphide-based core) (or particle including the core, for example, a particle having a core-shell structure, for example, a particle having a first shell including zinc selenide on the core including indium phosphide), the core or the like may be prepared according to any suitable methods which are not particularly limited. The formation of a core (or particle including core) and the formation of ZnS may be performed in continuous or in stepwise, which is not particularly limited.

The amount of each compound in the reaction system may be appropriately selected taking into consideration the desirable thickness or size of the first semiconductor nanocrystal in quantum dots.

The organic solvent used in the method according to an embodiment is not particularly limited, but may include any suitable organic solvent that is capable of being used for preparing a zinc sulfide semiconductor nanocrystal. Examples of the organic solvent may include a C6 to C22 primary amine such as hexadecylamine; a C6 to C22 secondary amine such as dioctylamine; a C6 to C40 tertiary amine such as trioctylamine; a nitrogen-containing heterocyclic compound such as pyridine; a C6 to C40 aliphatic hydrocarbon (e.g., alkane, alkene, alkyne, etc.) such as hexadecane, octadecane, octadecene, or squalane; a C6 to C30 aromatic hydrocarbon such as phenyldodecane, phenyltetradecane, or phenyl hexadecane; a phosphine substituted with a C6 to C22 alkyl group such as trioctylphosphine; a phosphine oxide substituted with a C6 to C22 alkyl group such as trioctylphosphine oxide; a C12 to C22 aromatic ether such as phenyl ether, or benzyl ether, or a combination thereof, but are not limited thereto. The type and the content of the organic solvent may be appropriately selected taking into consideration compounds in the reaction system and amounts of compounds in the reaction system. The amount of each compound in the reaction system may be also appropriately adjusted if desired (e.g., taking into consideration a desired thickness of ZnS and the precursor(s), and the like), but may be not particularly limited. According to an embodiment, the amount of zinc halide may be greater than or equal to about 10 mol %, greater than or equal to about 20 mol %, greater than or equal to about 30 mol %, or greater than or equal to about 40 mol % and less than or equal to about 100 mol %, less than or equal to about 90 mol %, less than or equal to about 80 mol %, or less than or equal to about 70 mol %, based on a total number of moles of the sulfur precursor. The amount of the Lewis metal halide used may be greater than or equal to about 10 mol %, greater than or equal to about 20 mol %, greater than or equal to about 30 mol %, or greater than or equal to about 40 mol % and less than or equal to about 100 mol %, less than or equal to about 90 mol %, less than or equal to about 80 mol %, or less than or equal to about 70 mol %, based on a total number of moles of the sulfur precursor.

In the reaction system, the order of injecting the zinc precursor, the sulfur precursor, the acid base adduct, and the zinc halide is not particularly limited, but may be appropriately selected. In an embodiment, a first layer including the third semiconductor nanocrystal is formed on the core, a sulfur precursor, and a metal halide (e.g., zinc halide) are injected at a time point of disappearing the non-metal precursor for forming the first layer, and subsequently, the acid base adduct may be injected thereto.

The reaction temperature may be greater than or equal to about 250° C., for example, greater than or equal to about 280° C., or greater than or equal to about 290° C. For example, the reaction temperature may be less than or equal to about 350° C., for example, less than or equal to about 340° C., or less than or equal to about 330° C. For example, the reaction temperature may be within a range from about 300° C. to about 340° C.

A reaction time is not particularly limited, but may be selected appropriately. For example, the reaction may be performed, for example, for greater than or equal to about 20 minutes, or greater than or equal to about 25 minutes, but is not limited thereto. Each precursor/compound may be added in a single step or a plurality of steps. When adding a precursor or the like stepwise, the reaction may be performed for a predetermined time (e.g., greater than or equal to about 5 minutes, greater than or equal to about 10 minutes, or greater than or equal to about 15 minutes) in each step. The reaction may be performed under an inert gas atmosphere or air or under vacuum, but is not limited thereto.

The addition of a nonsolvent to the prepared final reaction solution may allow nanocrystals coordinated with the organic ligands to be separated (e.g., precipitated). The nonsolvent may be a polar solvent that is miscible with the solvent used in the reaction and nanocrystals are not dispersible therein. The nonsolvent may be selected depending on the solvent used in the reaction and may be for example, acetone, ethanol, butanol, isopropanol, ethanediol, water, tetrahydrofuran (THF), dimethylsulfoxide (DMSO), diethylether, formaldehyde, acetaldehyde, a solvent having a similar solubility parameter to the foregoing solvents, or a combination thereof. The separation may be performed using centrifugation, precipitation, chromatography, or distillation. The separated nanocrystals may be added to the washing solvent and then washed as desired. The washing solvent is not particularly limited, and a solvent having a solubility parameter similar to that of the ligand may be used. Examples thereof may include hexane, heptane, octane, chloroform, toluene, and benzene.

The composition according to an embodiment includes the aforementioned (e.g., a plurality of) quantum dot(s); a dispersing agent; and an (organic) solvent. The dispersing agent may include a binder polymer including a carboxylic acid group. The composition may further include a photopolymerizable monomer including a carbon-carbon double bond and optionally (thermal or photo) initiator.

An amount of the quantum dot in the composition may be appropriately adjusted taking into consideration a desirable final use (e.g., color filter, etc.). In an embodiment, the content of the quantum dot may be greater than or equal to about 1 weight percent (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on a total solids content of the composition. The amount of the quantum dot may be less than or equal to about 70 wt %, for example, less than or equal to about 65 wt %, less than or equal to about 60 wt %, less than or equal to about 55 wt %, or less than or equal to about 50 wt %, based on a total solids content of the composition.

The composition according to an embodiment may be used to produce a quantum dot-polymer composite pattern. The composition according to an embodiment may be a quantum dot-containing photoresist composition to which a photolithography method may be applied. The composition according to an embodiment may be an ink composition that may provide a pattern by printing (e.g., a droplet discharge method such as inkjet printing). The composition according to an embodiment does not include a conjugated polymer (except a cardo binder that will be described below). The composition according to an embodiment may include a conjugated polymer. Herein, the conjugated polymer refers to a polymer having a conjugated double bond in its main chain, e.g., a main chain of a backbone structure of the polymer (e.g., polyphenylenevinylene, etc.).

In the composition according to an embodiment, a dispersing agent may ensure dispersion of the quantum dot. In an embodiment, the dispersing agent may be a binder polymer. The binder polymer may include a carboxylic acid group. The binder polymer may include a copolymer of a monomer mixture including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;
  a multiple aromatic ring-containing polymer having a backbone structure in which two aromatic rings are bound to a quaternary carbon atom that is a constituent atom of another cyclic moiety in the main chain and including a carboxylic acid group (—COOH) (hereinafter, a cardo binder); or
  a combination thereof.

The copolymer includes a first repeating unit derived from the first monomer and a second repeating unit derived from the second monomer, and optionally a third repeating unit derived from the third monomer.

Examples of the first monomer may include carbonic acid vinyl ester compounds such as acrylic acid, methacrylic acid, maleic acid, itaconic acid, fumaric acid, 3-butenoic acid, vinyl acetate, or vinyl benzoate, but are not limited thereto. One or more first monomers may be used. Examples of the second monomer may be an alkenyl aromatic compound such as styrene, alpha-methyl styrene, vinyl toluene, or vinyl benzyl methyl ether; an unsaturated carbonic acid ester compound such as methyl acrylate, methyl methacrylate, ethyl acrylate, ethyl methacrylate, butyl acrylate, butyl methacrylate, benzyl acrylate, benzyl methacrylate, cyclohexyl acrylate, cyclohexyl methacrylate, phenyl acrylate, or phenyl methacrylate; an unsaturated carbonic acid amino alkyl ester compound such as 2-amino ethyl acrylate, 2-amino ethyl methacrylate, 2-dimethyl amino ethyl acrylate, or 2-dimethyl amino ethyl methacrylate; a maleimide such as N-phenylmaleimide, N-benzylmaleimide, N-alkylmaleimide; an unsaturated carbonic acid glycidyl ester compound such as glycidyl acrylate or glycidyl methacrylate; a vinyl cyanide compound such as acrylonitrile, methacrylonitrile; or a unsaturated amide compound such as acryl amide or methacryl amide, but are not limited thereto. One or more second monomers may be used. Specific examples of the third monomer may include 2-hydroxy ethyl acrylate, 2-hydroxy ethyl methacrylate, 2-hydroxy butyl acrylate, or 2-hydroxy butyl methacrylate, but are not limited thereto. One or more third monomers may be used.

In the carboxylic acid group-containing polymer (also referred to as a binder or a binder polymer), the content of each of the first repeating unit or the second repeating unit may independently be greater than or equal to about 10 mol %, for example, greater than or equal to about 15 mol %, greater than or equal to about 25 mol %, or greater than or equal to about 35 mol %, based on a total number of moles in the carboxylic acid group containing polymer. In the carboxylic acid group containing polymer, an amount of the first repeating unit or the second repeating unit may be less than or equal to about 90 mol %, for example, 89 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %, based on a total number of moles in the carboxylic acid group containing polymer. In the carboxylic acid group containing polymer, if present, an amount of the third repeating unit may be greater than or equal to about 1 mol %, for example, greater than or equal to about 5 mol %, greater than or equal to about 10 mol %, or greater than or equal to about 15 mol %, based on a total number of moles in the carboxylic acid group containing polymer. In the binder polymer, an amount of the third repeating unit may be less than or equal to about 30 mol %, for example, less than or equal to about 25 mol %, less than or equal to about 20 mol %, less than or equal to about 18 mol %, less than or equal to about 15 mol %, or less than or equal to about 10 mol %, based on a total number of moles in the binder polymer.

The carboxylic acid group-containing polymer may include a multiple aromatic ring-containing polymer. The multiple aromatic ring-containing polymer is known as a cardo binder resin and may commercially available.

The carboxylic acid group-containing polymer may have an acid value of greater than or equal to about 50 milligrams of potassium hydroxide per gran) (mg KOH/g). For example, the carboxylic acid group containing polymer may have an acid value of greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, greater than or equal to about 110 mg KOH/g, greater than or equal to about 120 mg KOH/g, greater than or equal to about 125 mg KOH/g, or greater than or equal to about 130 mg KOH/g. The acid value of the carboxylic acid group-containing polymer may be for example less than or equal to about 250 mg KOH/g, less than or equal to about for example, 240 mg KOH/g, less than or equal to about 230 mg KOH/g, less than or equal to about 220 mg KOH/g, less than or equal to about 210 mg KOH/g, less than or equal to about 200 mg KOH/g, less than or equal to about 190 mg KOH/g, less than or equal to about 180 mg KOH/g, or less than or equal to about 160 mg KOH/g, but is not limited thereto. The binder polymer may have a weight average molecular weight of greater than or equal to about 1,000 grams per mole (g/mol), for example, greater than or equal to about 2,000 g/mol, greater than or equal to about 3,000 g/mol, or greater than or equal to about 5,000 g/mol. The binder polymer may have a weight average molecular weight of less than or equal to about 100,000 g/mol, for example less than or equal to about 50,000 g/mol.

In the composition, an amount of the binder polymer may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt %, based on a total weight of the composition, but is not limited thereto. The amount of the binder polymer may be less than or equal to about 35 wt %, for example less than or equal to about 33 wt %, or less than or equal to about 30 wt %, based on a total weight of the composition. Within the ranges, dispersion of the quantum dot may be ensured. The amount of the binder polymer may be about 0.5 wt % to about 55 wt %, based on a total weight of solids in the composition.

In the composition, the polymerizable (e.g., photopolymerizable) monomer including the carbon-carbon double bond may include a (e.g., photopolymerizable) acryl-based monomer. The polymerizable monomer may be a precursor for an insulating polymer. The acryl-based monomer may include alkyl(meth)acrylate, ethylene glycol di(meth)acrylate, triethylene glycol di(meth)acrylate, diethylene glycol di(meth)acrylate, 1,4-butanediol di(meth)acrylate, 1,6-hexanediol di(meth)acrylate, neopentyl glycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, pentaerythritol hexa(meth)acrylate, bisphenol A di(meth)acrylate, bisphenol A epoxy(meth)acrylate, trimethylolpropane tri(meth)acrylate, ethylene glycolmonomethylether (meth)acrylate, novolac epoxy (meth)acrylate, diethylene glycol di(meth)acrylate, triethylene glycol di(meth)acrylate, propylene glycol di(meth)acrylate, tris(meth)acryloyloxyethyl phosphate, or a combination thereof.

An amount of the polymerizable monomer may be greater than or equal to about 0.5 wt %, for example, greater than or equal to about 1 wt % or greater than or equal to about 2 wt %, based on a total weight of the composition. The amount of the photopolymerizable monomer may be less than or equal to about 30 wt %, for example, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt %, based on a total weight of the composition.

The initiator in the composition may be used for polymerization of the monomers. The initiator is a compound accelerating a radical reaction (e.g., radical polymerization of monomer) by producing radical chemical species under a mild condition (e.g., by heat or light). The initiator may be a thermal initiator or a photoinitiator. The initiator is a compound capable of initiating a radical polymerization of the polymerizable acrylic monomer, a thiol compound (which will be described below), or a combination thereof by light. The initiator is not particularly limited. The initiator may be a thermal initiator. The thermal initiator may include azobisisobutyronitrile, benzoyl peroxide, and the like, but is not limited thereto. The initiator may be a photoinitiator. The photoinitiator may include a triazine-based compound, an acetophenone compound, a benzophenone compound, a thioxanthone compound, a benzoin compound, an oxime ester compound, an aminoketone compound, a phosphine or phosphineoxide compound, a carbazole-based compound, a diketone compound, a sulfonium borate-based compound, a diazo-based compound, a biimidazole-based compound, or a combination thereof, but is not limited thereto.

In the composition, an amount of the initiator may be appropriately adjusted taking into consideration the polymerizable monomers and amounts of the polymerizable monomers. In an embodiment, the initiator may be used in an amount range of about 0.01 wt % to about 10 wt %, based on a total weight of the composition, but is not limited thereto.

The composition may further include a (multi- or monofunctional) thiol compound including at least one (e.g., at least two, three, or four) thiol group(s) (for example, at a terminal end of the (multi- or mono-functional) thiol compound), a metal oxide particulate, or a combination thereof.

The metal oxide particulate may include $TiO_2$, $SiO_2$, $BaTiO_3$, $Ba_2TiO_4$, ZnO, or a combination thereof. In the composition, an amount of the metal oxide particulate may be greater than or equal to about 1 wt % and less than or equal to about 15 wt %, less than or equal to about 10 wt %, or less than or equal to about 5 wt %, based on a total weight of solids in the composition. The metal oxide particulate may have an appropriately selected diameter without a particular limit. The diameter of the metal oxide particulate may be greater than or equal to about 100 nm, for example, greater than or equal to about 150 nm, or greater than or equal to about 200 nm and less than or equal to about 1,000 nm or less than or equal to about 800 nm.

The multi-functional thiol compound may include a compound represented by Chemical Formula 1:

Chemical Formula 1

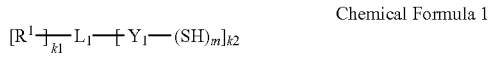

wherein, in Chemical Formula 1, $R^1$ is hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; —$NH_2$; a substituted or unsubstituted C1 to C30 amine group (—NRR', wherein R and R' are independently hydrogen or a C1 to C30 linear or branched alkyl group provided that both are not simultaneously hydrogen); an isocyanate group; a halogen; —ROR' (wherein R is a substituted or unsubstituted C1 to C20 alkylene group and R' is hydrogen or a C1 to C20 linear or branched alkyl group); an acyl halide (—RC(═O)X, wherein R is a substituted or unsubstituted alkylene group and X is a halogen); —C(═O)OR' (wherein R' is hydrogen or a C1 to C20 linear or branched alkyl group); —CN; —C(═O)NRR' (wherein R and R' are independently hydrogen or a C1 to C20 linear or branched alkyl group); or —C(═O)ONRR' (wherein R and R' are independently hydrogen or a C1 to C20 linear or branched alkyl group), $L_1$ is a carbon atom, a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heterocycloalkylene group, or a substituted or unsubstituted C3 to C30 heteroarylene group, wherein a methylene moiety (—$CH_2$—) of the substituted or unsubstituted C1 to C30 alkylene group may be replaced by a sulfonyl moiety (—$SO_2$—), a carbonyl moiety (CO), an ether moiety (—O—), a sulfide moiety (—S—), a sulfoxide moiety (—SO—), an ester moiety (—C(═O)O—), an amide moiety (—C(═O)NR—) (wherein R is hydrogen or a C1 to C10 alkyl group) or a combination thereof, $Y_1$ is a single bond; a substituted or unsubstituted C1 to C30 alkylene group; a substituted or unsubstituted C2 to C30 alkenylene group; a C1 to C30 alkylene group or a C2 to C30 alkenylene group wherein a methylene moiety (—$CH_2$—) is replaced by a sulfonyl moiety (—S(═O)$_2$—), a carbonyl moiety (—C(═O)—), an ether moiety (—O—), a sulfide moiety (—S—), a sulfoxide moiety (—S(═O)—), an ester moiety (—C(═O)O—), an amide moiety (—C(═O)NR—) (wherein R is hydrogen or a C1 to C10 linear or branched alkyl group), an imine moiety (—NR—) (wherein R is hydrogen or a C1 to C10 linear or branched alkyl group), or a combination thereof, m is an integer of 1 or greater, k1 is an integer of 0 or 1 or greater, k2 is an integer of 1 or greater, a sum of m and k2 is an integer of 3 or greater, and when $Y_1$ is not a single bond, m does not exceed a valence of $Y_1$, and a sum of k1 and k2 does not exceed a valence of $L_1$.

The multi-functional thiol compound may be a dithiol compound, a trithiol compound, tetrathiol compound, or a combination thereof. For example, the thiol compound may be glycol di-3-mercaptopropionate, glycol dimercapto acetate, trimethylolpropane tris(3-mercaptopropionate), pentaerythritol tetrakis (3-mercaptopropionate), pentaerythritol tetrakis (2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

An amount of the thiol compound may be less than or equal to about 50 wt %, less than or equal to about 45 wt %, less than or equal to about 40 wt %, less than or equal to about 35 wt %, less than or equal to about 30 wt %, less than or equal to about 25 wt %, less than or equal to about 20 wt %, less than or equal to about 15 wt %, less than or equal to about 10 wt %, less than or equal to about 9 wt %, less than or equal to about 8 wt %, less than or equal to about 7 wt %, less than or equal to about 6 wt %, or less than or equal to about 5 wt %, based on a total weight (or total solid content) of the composition. The amount of the thiol compound may be greater than or equal to about 0.1 wt %, for example, greater than or equal to about 0.5 wt %, greater than or equal to about 1 wt %, greater than or equal to about 5 wt %, greater than or equal to about 10 wt %, greater than or equal to about 15 wt %, greater than or equal to about 20 wt %, or greater than or equal to about 25 wt %, based on a total weight (or total solid content) of the composition.

The composition may further include an organic solvent (or a liquid vehicle). The organic solvent is not particularly limited. The organic solvent and an amount of the organic solvent may be appropriately determined by taking into consideration the above main components (i.e., the quantum dot, the dispersing agent, the polymerizable monomer, the initiator, and if used, the thiol compound) and an additive and an amount of the additive which is described below. The composition may include an organic solvent in a residual amount except for a desired content of the (non-volatile) solid. Examples of the organic solvent (or liquid vehicle) may include ethyl 3-ethoxy propionate, ethylene glycols such as ethylene glycol, diethylene glycol, or polyethylene glycol; glycolethers such as ethylene glycolmonomethylether, ethylene glycolmonoethylether, diethylene glycolmonomethylether, ethylene glycoldiethylether, or diethylene glycoldimethylether; glycolether acetates such as ethylene glycol acetate, ethylene glycolmonoethylether acetate, diethylene glycolmonoethylether acetate, or diethylene glycolmonobutylether acetate; propylene glycol; propylene glycolethers such as propylene glycolmonomethylether, propylene glycolmonoethylether, propylene glycolmonopropylether, propylene glycolmonobutylether, propylene glycoldimethylether, dipropylene glycoldimethylether, propylene glycoldiethylether, or dipropylene glycoldiethylether; propylene glycolether acetates such as propylene glycolmonomethylether acetate, or dipropylene glycolmonoethylether acetate; amides such as N-methylpyrrolidone, dimethyl formamide, or dimethyl acetamide; ketones such as methylethylketone (MEK), methylisobutylketone (MIBK), or cyclohexanone; petroleums such as toluene, xylene, or solvent naphtha; esters such as ethyl acetate, butyl acetate, or ethyl lactate; ethers such as diethyl ether, dipropyl ether, or dibutyl ether; aliphatic, alicyclic, or aromatic hydrocarbons; or a mixture thereof.

If desired, the composition may further include various additives such as a light diffusing agent, a leveling agent, or a coupling agent in addition to the aforementioned components. The amount of the additive is not particularly limited, and may be controlled within an appropriate range wherein the additive does not cause an adverse effect on preparation of the composition and production of the quantum dot-polymer composite and optionally a patterning of the composite.

If used, the additives may be used in an amount of greater than or equal to about 0.1 wt %, for example, greater than or equal to about 0.5 wt %, greater than or equal to about 1 wt %, greater than or equal to about 2 wt %, or greater than or equal to about 5 wt %, based on a total weight of the composition, but is not limited thereto. If used, the content of the additives may be less than or equal to about 20 wt %, for example, less than or equal to about 19 wt %, less than or equal to about 18 wt %, less than or equal to about 17 wt %, less than or equal to about 16 wt %, or less than or equal to about 15 wt %, based on a total weight of the composition, but is not limited thereto.

The composition according to an embodiment may be prepared by a method including: preparing quantum dot dispersion including the aforementioned quantum dot, the dispersing agent, and the organic solvent; and mixing the quantum dot dispersion with the initiator; the polymerizable monomer (e.g., acryl-based monomer); optionally the thiol compound; optionally the metal oxide particulate, and optionally the additives. Each of the aforementioned components may be mixed sequentially or simultaneously, but mixing orders are not particularly limited.

The composition may provide a quantum dot-polymer composite by a (e.g., radical) polymerization.

In an embodiment, the quantum dot-polymer composite includes a polymer matrix; and the aforementioned quantum dot dispersed in the polymer matrix. The polymer matrix may include a dispersing agent (e.g., a binder polymer including a carboxylic acid group), a polymerization product (e.g., an insulating polymer) of an ene compound, i.e., a polymerizable monomer having a carbon-carbon double bond (at least one, for example, at least two, at least three, at least four, or at least five carbon-carbon double bonds), optionally a polymerization product of the polymerizable monomer and a thiol compound including at least one thiol group (e.g., at a terminal end of the thiol compound), preferably a multi-functional thiol compound including at least one, preferably at least two thiol groups (e.g., at a terminal end of the multi-functional thiol compound), a metal oxide particulate(s), or a combination thereof.

In an embodiment, the polymer matrix may include a cross-linked polymer and a dispersing agent (e.g., a carboxylic acid group-containing binder polymer). In an embodiment, the polymer matrix does not include a conjugated polymer (except for a cardo resin). The cross-linked polymer may include a thiolene resin, a cross-linked poly(meth)acrylate, or a combination thereof. In an embodiment, the cross-linked polymer may be a polymerization product of the ene compound (the polymerizable monomer) and, optionally, the multi-functional thiol compound.

The non-cadmium-based quantum dot, the dispersing agent, or the binder polymer, the polymerizable monomer, and the multi-functional thiol compound are the same as described above.

The film of the quantum dot-polymer composite or the quantum dot-polymer composite pattern that will be described below may have for example a thickness, less than or equal to about 30 µm, for example less than or equal to about 25 µm, less than or equal to about 20 µm, less than or equal to about 15 µm, less than or equal to about 10 µm, less than or equal to about 8 µm, less than or equal to about 7 µm and greater than or equal to about 2 µm, for example, greater than or equal to about 3 µm, greater than or equal to about 3.5 µm, or greater than or equal to about 4 µm.

In an embodiment, patterned film includes a repeating section including a first section configured to emit a first light, wherein the first section includes the quantum dot-polymer composite. The repeating section may include a second section emitting a second light having a different maximum (photoluminescence) peak wavelength from the first light, wherein the second section may include a quantum dot-polymer composite. The quantum dot-polymer composite of the second section may include a second quantum dot configured to emit the second light. The second quantum dot may include the aforementioned quantum dot. The first light or the second light may be red light having a maximum photoluminescence peak wavelength which is present between about 600 nm and about 650 nm (e.g., about 620 nm to about 650 nm) or green light having a maximum photoluminescence peak wavelength which is present between about 500 nm and about 550 nm (e.g., about 510 nm to about 540 nm). The patterned film may further include a third section emitting or passing a third light (e.g., blue light) different from the first light and the second light. The third light may have a maximum peak wavelength ranging from about 380 nm to about 480 nm.

In an embodiment, a display device includes a light source and a photoluminescence element, and the photoluminescence element includes a substrate and an emission layer disposed on the substrate, and the emission layer includes a film or patterned film of the quantum dot-polymer composite. The light source is configured to provide the photoluminescence element with incident light. The incident light may have a (photoluminescence) peak wavelength of greater than or equal to about 440 nm, for example, greater than or equal to about 450 nm and less than or equal to about 500 nm, for example, less than or equal to about 480 nm, less than or equal to about 470 nm, or less than or equal to about 460 nm.

In the emission layer (e.g., patterned film of quantum dot-polymer composite) of the display device according to an embodiment, the first section may be a section emitting red light, and the second section may be a section emitting green light, and the light source may be an element emitting blue light.

Optical elements (blue light blocking layer or first optical filter which will be described below) for blocking (e.g., reflecting or absorbing) blue light may be disposed on front surfaces (light-emitting surfaces) of the first section and the second section.

In the aforementioned display device, the light source may include a plurality of light emitting units corresponding to the first section and the second section, respectively, and the light emitting units may include a first electrode and a second electrode facing each other and an electroluminescence layer disposed between the first electrode and the second electrode. The electroluminescence layer may include an organic light emitting material. For example, each light emitting unit of the light source may include an electroluminescent device (e.g., an organic light emitting diode (OLED)) configured to emit light of a predetermined wavelength (e.g., blue light, green light, or a combination thereof). Structures and materials of the electroluminescent device and the organic light emitting diode (OLED) may be selected appropriately and are not particularly limited. The light source includes an organic light emitting diode (OLED) emitting blue light (and optionally, green light).

Figure 2:
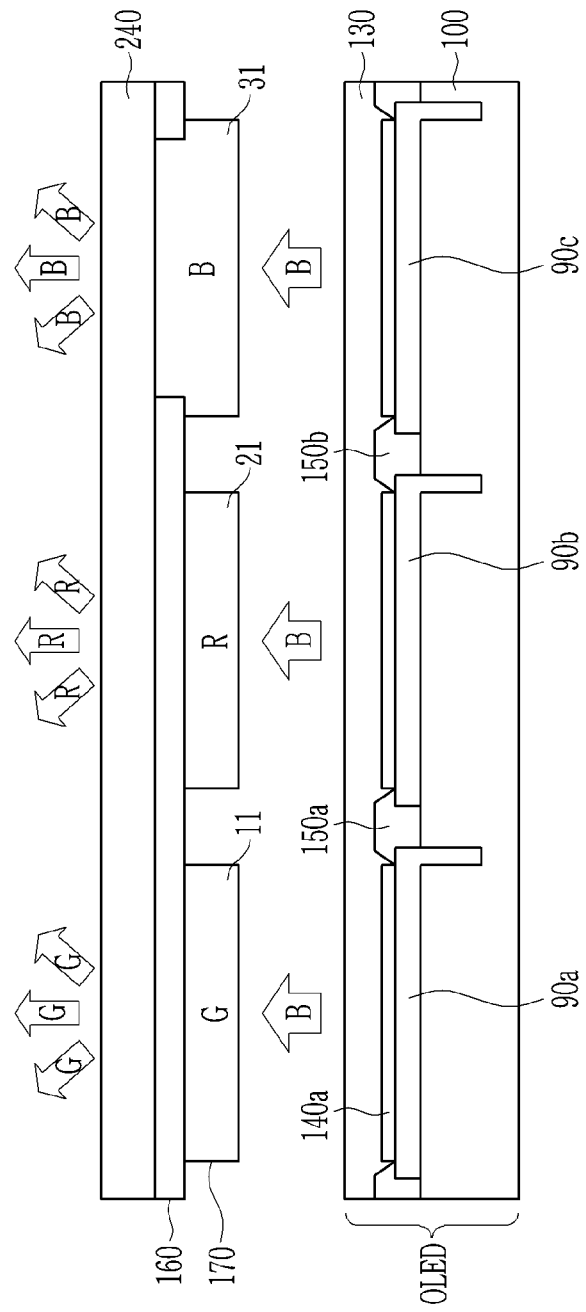
FIG. 2 is a schematic view of a cross-section of a device according to an embodiment.
Figure 3:
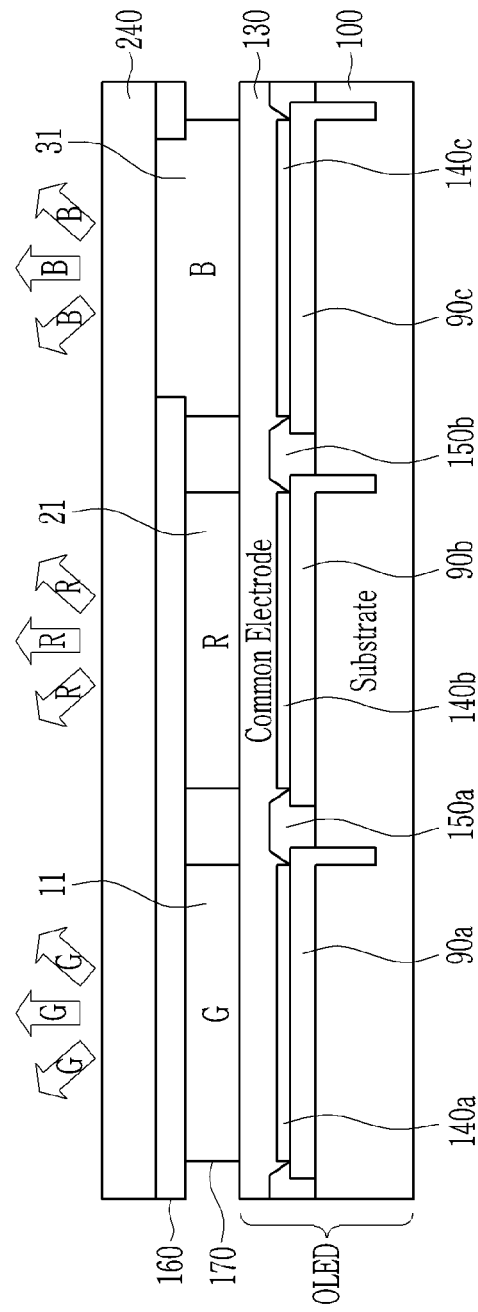
FIG. 3 is a schematic view of a cross-section of a device according to an embodiment.

FIGS. 2 and 3 are schematic cross-sectional views of display devices according to embodiments. Referring to FIGS. 2 and 3, a light source includes an organic light emitting diode (OLED) emitting blue light. The organic light emitting diode OLED may include (at least two, for example, three or more) pixel electrodes 90a, 90b, 90c formed on a substrate 100, a pixel defining layer 150a, 150b formed between the adjacent pixel electrodes 90a, 90b, 90c, an organic light emitting layer 140a, 140b, 140c formed on the pixel electrodes 90a, 90b, 90c, and a common electrode layer 130 formed on the organic light emitting layer 140a, 140b, 140c.

A thin film transistor and a substrate may be disposed under the organic light emitting diode (OLED).

The pixel areas of the OLED may be disposed corresponding to the first, second, and third sections that will be described in detail below, respectively.

A stack structure including a quantum dot-polymer composite (e.g., a section including red quantum dot and a section including green quantum dot) pattern and a substrate may be disposed on the light source. The sections are configured so that blue light emitted from the light source is entered thereinto and red light and green light may be emitted, respectively. Blue light emitted from the light source may pass through the third section.

The light (e.g., blue light) emitted from the light source may enter the second section 21 and the first section 11 of the quantum dot-polymer composite pattern 170 to emit (e.g., converted) red light R and green light G, respectively. The blue light B emitted from the light source passes through or transmits from the third section 31. Over the second section emitting red light, the first section emitting green light, or a combination thereof, an optical element 160 may be disposed. The optical element may be a blue cut layer which cuts (e.g., reflects or absorbs) blue light and optionally green light, or a first optical filter layer 310 (see FIG. 4). The blue cut layer 160 may be disposed on the upper substrate 240. The blue cut layer 160 may be disposed between the upper substrate 240 and the quantum dot-polymer composite pattern and over the first section 11 and the second section 21. Details of the blue cut layer are the same as set forth for the first optical filter layer 310 below.

The display device may be obtained by separately fabricating the stack structure and (e.g., blue light emitting) LED or OLED and then assembling the same. Alternatively, the display device may be obtained by forming a quantum dot-polymer composite pattern directly on the LED or OLED.

The substrate may be a substrate including an insulating material. The substrate may include glass; various polymers such as a polyester (e.g., polyethylene terephthalate (PET) polyethylene naphthalate (PEN)); a polymethacrylate, or a polyacrylate; a polycarbonate; a polysiloxane (e.g., polydimethylsiloxane (PDMS)); an inorganic material such as $Al_2O_3$ or ZnO; or a combination thereof, but is not limited thereto. A thickness of the substrate may be selected appropriately taking into consideration a substrate material but is not particularly limited. The substrate may have flexibility. The substrate may have a transmittance of greater than or equal to about 50%, greater than or equal to about 60%, greater than or equal to about 70%, greater than or equal to about 80%, or greater than or equal to about 90% for light emitted from the quantum dot.

A wire layer including a thin film transistor or the like is formed on the substrate. The wire layer may further include a gate line, a sustain voltage line, a gate insulating layer, a data line, a source electrode, a drain electrode, a semiconductor, a protective layer, and the like. The detail structure of the wire layer may be verified according to an embodiment. The gate line and the sustain voltage line are electrically separated from each other, and the data line is insulated and crossing the gate line and the sustain voltage line. The gate electrode, the source electrode, and the drain electrode form a control terminal, an input terminal, and an output terminal of the thin film transistor, respectively. The drain electrode is electrically connected to the pixel electrode that will be described below.

The pixel electrode may function as an anode of the display device. The pixel electrode may be formed of a transparent conductive material such as indium tin oxide (ITO) or indium zinc oxide (IZO). The pixel electrode may be formed of a material having a light-blocking property such as gold (Au), platinum (Pt), nickel (Ni), tungsten (W), chromium (Cr), molybdenum (Mo), iron (Fe), cobalt (Co), copper (Cu), palladium (Pd), or titanium (Ti). The pixel electrode may have a two-layered structure in which the transparent conductive material and the material having a light-blocking property are stacked sequentially.

Between two adjacent pixel electrodes, a pixel define layer (PDL) overlapped with a terminal end of the pixel electrode to divide the pixel electrode into a pixel unit. The pixel define layer is an insulation layer which may electrically block the at least two pixel electrodes.

The pixel define layer covers a portion of the upper surface of the pixel electrode, and the remaining region of the pixel electrode that is not covered by the pixel define layer may provide an opening. An organic emission layer that will be described below may be formed on the region defined by the opening.

The organic emission layer defines each pixel area by the pixel electrode and the pixel define layer. In other words, one pixel area may be defined as an area formed with one organic emission unit layer which is contacted with one pixel electrode divided by the pixel define layer.

For example, in the display device according to an embodiment, the organic emission layer may be defined as a first pixel area, a second pixel area and a third pixel area, and each pixel area is spaced apart from each other leaving a predetermined interval by the pixel define layer.

In an embodiment, the organic emission layer may emit a third light belonging to a visible light region or belonging to an ultraviolet (UV) region. That is, each of the first to the third pixel areas of the organic emission layer may emit a third light. In an embodiment, the third light may be a light having the highest energy in the visible light region, for example, may be blue light. When all pixel areas of the organic emission layer are designed to emit the same light, e.g., the same colored light, each pixel area of the organic emission layer may be formed of the same or similar materials or may show, e.g., exhibit, the same or similar properties. Thus a process difficulty of forming the organic emission layer may be reduced, e.g., relieved, and the display device may be applied for, e.g., used in, a large scale/large area process. However, the organic emission layer according to an embodiment is not necessarily limited thereto, but the organic emission layer may be designed to emit at least two different lights.

The organic emission layer includes an organic emission unit layer in each pixel area, and each organic emission unit layer may further include an auxiliary layer (e.g., hole injection layer (HIL), hole transport layer (HTL), electron transport layer (ETL), etc.) besides the emission layer.

The common electrode may function as a cathode of the display device. The common electrode may be formed of a transparent conductive material such as indium tin oxide (ITO) or indium zinc oxide (IZO). The common electrode may be formed on the organic emission layer and may be integrated therewith.

A planarization layer or a passivation layer may be formed on the common electrode. The planarization layer may include a (e.g., transparent) insulating material for ensuring electrical insulation with the common electrode.

In an embodiment, the display device may further include a lower substrate, a polarizer disposed under the lower substrate, and a liquid crystal layer disposed between the stack structure and the lower substrate, and in the stack structure, the light emission (photoluminescent) layer 230 may be disposed to face the liquid crystal layer. The display device may further include a polarizer between the liquid crystal layer and the light emission (photoluminescent) layer 230. The light source may further include LED and if desired, a light guide panel.

Figure 4:
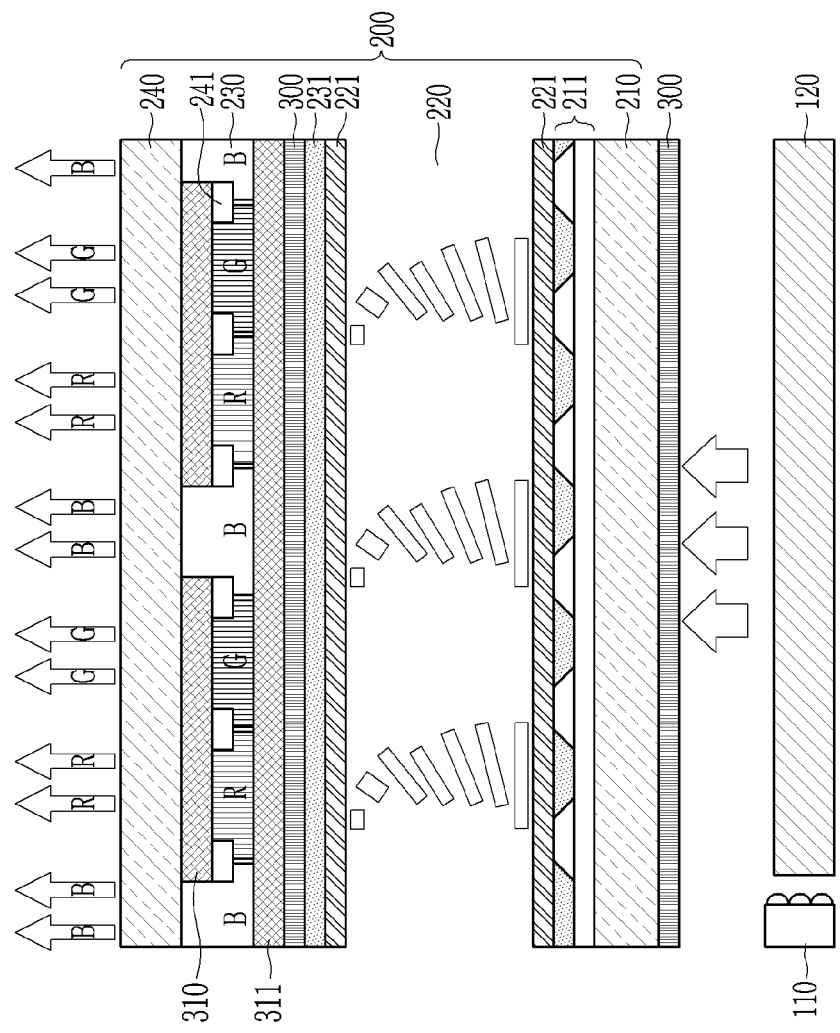
FIG. 4 is a schematic view of a cross-section of a device according to an embodiment.

Non-limiting examples of the display device (e.g., a liquid crystal display device) according to an embodiment are illustrated with a reference to a drawing. FIG. 4 is a schematic cross sectional view showing a liquid crystal display according to an embodiment. The display device of an embodiment may include a liquid crystal panel 200, a lower polarizer 300 disposed under the liquid crystal panel 200, and a backlight unit (BLU) disposed under the lower polarizer 300.

The liquid crystal panel 200 includes a lower substrate 210, a stack structure, and a liquid crystal layer 220 disposed between the stack structure and the lower substrate. The stack structure includes a transparent substrate (or referred to as an upper substrate) 240 and a photoluminescent layer 230 including a pattern including a quantum dot-polymer composite.

The lower substrate 210 that is also referred to as an array substrate may be a transparent insulating material substrate. The substrate is the same as described above. A wire plate 211 is provided on an upper surface of the lower substrate 210. The wire plate 211 may include a plurality of gate wires (not shown) and data wires (not shown) that define a pixel area, a thin film transistor disposed adjacent to a crossing region of gate wires and data wires, and a pixel electrode for each pixel area, but is not limited thereto. Details of such a wire plate are not particularly limited.

The liquid crystal layer 220 may be disposed on the wire plate 211. The liquid crystal layer 220 may include an alignment layer 221 on and under the liquid crystal layer 220 to initially align the liquid crystal material included therein. Details (e.g., a liquid crystal material, an alignment layer material, a method of forming liquid crystal layer, a thickness of liquid crystal layer, or the like) of the liquid crystal material and the alignment layer are known and are not particularly limited.

A lower polarizer 300 is provided under the lower substrate. Materials and structures of the lower polarizer 300 are known and are not particularly limited. A backlight unit (e.g., emitting blue light) may be disposed under the polarizer 300.

An upper optical element or an upper polarizer 300 may be provided between the liquid crystal layer 220 and the transparent substrate 240, but is not limited thereto. For example, the upper polarizer may be disposed between the liquid crystal layer 220 and the photoluminescent 230. The upper polarizer may be any suitable polarizer that may be used in a liquid crystal display device. The upper polarizer may be TAC (triacetyl cellulose) having a thickness of less than or equal to about 200 μm, but is not limited thereto. In an embodiment, the upper optical element may be a coating that controls a refractive index without a polarization function.

The backlight unit includes a light source 110. The light source may emit blue light or white light. The light source may include a blue LED, a white LED, a white OLED, or a combination thereof, but is not limited thereto.

The backlight unit may further include a light guide panel 120. In an embodiment, the backlight unit may be an edge-type lighting. For example, the backlight unit may include a reflector, a light guide panel provided on the reflector and providing a planar light source with the liquid crystal panel 200, at least one optical sheet on the light guide panel, for example, a diffusion plate, a prism sheet, and the like, or a combination thereof, but is not limited thereto. In an embodiment, the backlight unit does not include a light guide panel. In an embodiment, the backlight unit may be a direct lighting. For example, the backlight unit may have a reflector, and may have a plurality of fluorescent lamps disposed on the reflector at regular intervals, or may have an LED operating substrate on which a plurality of light emitting diodes may be disposed, a diffusion plate thereon, and optionally at least one optical sheet. Details (e.g., each component of a light emitting diode, a fluorescent lamp, light guide panel, various optical sheets, and a reflector) of such a backlight unit are known and are not particularly limited.

A black matrix (BM) 241 is provided under the transparent substrate 240 and has openings and hides a gate line, a data line, and a thin film transistor of the wire plate on the lower substrate. For example, the black matrix 241 may have a lattice shape. The photoluminescent layer 230 is provided in the openings of the black matrix 241 and has a quantum dot-polymer composite pattern including a first section (R) configured to emit a first light (e.g., red light), a second section (G) configured to emit a second light (e.g., green light), and a third section (B) configured to emit/transmit, for example blue light. If desired, the photoluminescent layer may further include at least one fourth section. The fourth section may include a quantum dot that emits light with a different color from light emitted from the first to third sections (e.g., cyan, magenta, and yellow light).

In the photoluminescent layer 230, sections forming a pattern may be repeated corresponding to pixel areas formed on the lower substrate. A transparent common electrode 231 may be provided on the photoluminescent layer (e.g., photoluminescent color filter layer).

The third section (B) configured to emit/transmit blue light may be a transparent color filter that does not change a (photo)luminescence spectrum of the light source. In this case, blue light emitted from the backlight unit may enter in a polarized state and may be emitted through the lower polarizer and the liquid crystal layer as is. If desired, the third section may include a quantum dot emitting blue light.

If desired, the display device may further include a light blocking layer (blue cut filter) or a first optical filter layer. The blue light blocking layer may be disposed between bottom surfaces of the first section (R) and the second section (G) and the upper substrate 240 or on a top surface of the upper substrate 240. The blue light blocking layer may include a sheet having openings that correspond to a pixel area showing, e.g., expressing, a blue color (e.g., third section) and may be formed on portions corresponding to the first and second sections. The first optical filter layer may be integrally formed as one body structure at the portions except portions overlapped with the third section, but is not limited thereto. At least two first optical filter layers may be spaced apart and be disposed on each of the positions overlapped with the first and the second sections.

In an embodiment, the first optical filter layer may block light having a portion of a wavelength region in the visible light region and transmit light having other wavelength regions. For example, the first optical filter layer may block blue light and transmit light except blue light. For example, the first optical filter layer may transmit green light, red light, and/or or yellow light that is mixed light thereof.

In an embodiment, the first optical filter layer may substantially block blue light having a wavelength of less than or equal to about 500 nm and may transmit light in another visible light wavelength region of greater than about 500 nm and less than or equal to about 700 nm.

In an embodiment, the first optical filter layer may have a light transmittance of greater than or equal to about 70%, greater than or equal to about 80%, greater than or equal to about 90%, or about 100% with respect to the other visible light of greater than about 500 nm and less than or equal to about 700 nm.

The first optical filter layer may include a polymer thin film including a dye, a pigment, or a combination thereof that absorbs light having a wavelength to be blocked. The first optical filter layer may block 80% or greater, for example, 82% or greater, 90% or greater, or 95% or greater of blue light having a wavelength of less than or equal to about 480 nm and may have a light transmittance of greater than or equal to about 70%, greater than or equal to about 80%, greater than or equal to about 90%, or about 100% with respect to other visible light of greater than about 500 nm and less than or equal to about 700 nm.

The first optical filter layer may block (e.g., absorb) and substantially block blue light having a wavelength of less than or equal to about 500 nm and for example may selectively transmit green light or red light. In this case, at least two first optical filter layers may be spaced apart and disposed on each of the portions overlapped with the first and second sections, respectively. For example, a first optical filter layer selectively transmitting red light may be disposed on the portion overlapped with the section emitting red light and the first optical filter layer selectively transmitting green light may be disposed on the portion overlapped with the section emitting green light, respectively. For example, the first optical filter layer may include a first region, a second region, or a combination thereof wherein the first region blocks (e.g., absorb) blue light and red light and transmits light having a wavelength of a predetermined range (e.g., greater than or equal to about 500 nm, greater than or equal to about 510 nm, or greater than or equal to about 515 nm and less than or equal to about 550 nm, less than or equal to about 545 nm, less than or equal to about 540 nm, less than or equal to about 535 nm, less than or equal to about 530 nm, less than or equal to about 525 nm, or less than or equal to about 520 nm) and the second region blocks (e.g., absorb) blue light and green light and transmits light having a wavelength of a predetermined range (e.g., greater than or equal to about 600 nm, greater than or equal to about 610 nm, or greater than or equal to about 615 nm and less than or equal to about 650 nm, less than or equal to about 645 nm, less than or equal to about 640 nm, less than or equal to about 635 nm, less than or equal to about 630 nm, less than or equal to about 625 nm, or less than or equal to about 620 nm). The first region may be disposed at a place overlapped with the section emitting green light and the second region may be disposed at a place overlapped with the section emitting red light. The first region and the second region may be optically isolated. The first optical filter (layer) may contribute to improving color purity of a display device.

The first optical filter layer may be a reflective filter including a plurality of layers (e.g., inorganic material layers) with different refractive index. For example, two layers having different refractive index may be alternately stacked with each other, or for example a layer having a high refractive index and a layer having a low refractive index may be alternately stacked with each other As refractive index different between the layer having a high refractive index and the layer having a low refractive index is higher, the first optical filter layer having higher wavelength selectivity may be provided. A thickness and the number of the stacked layer having a high refractive index and the layer having a low refractive index may be determined according to a refractive index of each layer and a reflected wavelength, for example, each layer having a high refractive index may have a thickness of about 3 nm to about 300 nm, and each layer having a low refractive index may have a thickness of about 3 nm to about 300 nm.

A total thickness of the first optical filter layer may be, for example, from about 3 nm to about 10,000 nm, about 300 nm to about 10,000 nm, or about 1,000 nm to about 10,000 nm. The high refractive index layers may have the same thickness, the same material, or a combination thereof as one another or a different thickness, a different material, or a combination thereof from each other. The low refractive index layers may have the same thickness, the same material, or a combination thereof as one another or a different thickness, a different material, or a combination thereof from each other.

The display device may further include a second optical filter layer 311 (e.g., a red/green or yellow light recycling layer) disposed between the photoluminescent layer and the liquid crystal layer (e.g., between a photoluminescent layer and an upper polarizer) and transmitting at least a part of the third light and reflecting at least a part of the first light and the second light. The second optical filter layer may reflect light in a wavelength region of greater than about 500 nm. The first light may be red light, the second light may be green light, and the third light may be blue light.

In the display device according to an embodiment, the second optical filter layer may be formed as an integrated single layer having an approximately planar surface.

In an embodiment, the second optical filter layer may include a monolayer having a low refractive index, for example, the second optical filter layer may be a transparent thin film having a refractive index of less than or equal to about 1.4, less than or equal to about 1.3, or less than or equal to about 1.2.

The second optical filter layer having a low refractive index may be, for example, a porous silicon oxide, a porous organic material, a porous organic/inorganic composite, or a combination thereof.

In an embodiment, the second optical filter layer may include a plurality of layers having different refractive indexes, for example, the second optical filter layer may be formed by alternately stacking two layers having different refractive indexes, or for example, the second optical filter layer may be formed by alternately stacking material having a high refractive index and material having a low refractive index.

The layer having a high refractive index in the second optical filter layer may include, for example, hafnium oxide, tantalum oxide, titanium oxide, zirconium oxide, magnesium oxide, cesium oxide, lanthanum oxide, indium oxide, niobium oxide, aluminum oxide, silicon nitride, or a combination thereof. According to an embodiment, the layer having a high refractive index in the second optical filter layer may include a variety of materials having a higher refractive index than the layer having a low refractive index.

The layer having a low refractive index in the second optical filter layer may include, for example, a silicon oxide. According to an embodiment, the layer having a low refractive index in the second optical filter layer may include a variety of materials having a lower refractive index than the layer having a high refractive index.

As the refractive index difference between the layer having a high refractive index and the layer having a low refractive index is the higher, the second optical filter layer may have the higher wavelength selectivity.

In the second optical filter layer, each thickness of the layer having a high refractive index and the layer having a low refractive index and the stacked number thereof may be determined depending upon a refractive index of each layer and the reflected wavelength, for example, each layer having a high refractive index in the second optical filter layer may have a thickness of about 3 nm to about 300 nm, and each layer having a low refractive index in the second optical filter layer may have a thickness of about 3 nm to about 300 nm. A total thickness of the second optical filter layer may be, for example, from about 3 nm to about 10,000 nm, about 300 nm to about 10,000 nm, or about 1,000 nm to about 10,000 nm. Each of the layer having a high refractive index and the layer having a low refractive index in the second optical filter layer may have the same thickness and materials or different thickness and materials from each other.

The second optical filter layer may reflect at least a portion of the first light (R) and the second light (G) and transmits at least a portion (e.g., whole part) of the third light (B). For example, the second optical filter layer 140 may transmit only the third light (B) in a blue light wavelength region of less than or equal to about 500 nm and light in a wavelength region of greater than about 500 nm, that is, green light (G), yellow light, red light (R), and the like may be not passed through the second optical filter layer and reflected. Thus, the reflected green light and red light may pass through the first and the second sections to be emitted to the outside of the display device.

The second optical filter layer may reflect light in a wavelength region of greater than about 500 nm in greater than or equal to about 70%, greater than or equal to about 80%, or greater than or equal to about 90%, or even about 100%.

Meanwhile, the second optical filter layer may have a transmittance to light in a wavelength region of less than or equal to about 500 nm of, for example, greater than or equal to about 90%, greater than or equal to about 92%, greater than or equal to about 94%, greater than or equal to about 96%, greater than or equal to about 98%, greater than or equal to about 99%, or even about 100%.

In an embodiment, the aforementioned stack structure may be produced by a method using the photoresist composition. The method may include
    forming a film of the composition on a substrate;
    exposing a selected region of the film to light (e.g., having a wavelength of less than or equal to about 400 nm); and
    developing the exposed film with an alkali developing solution to obtain a pattern of the quantum dot-polymer composite.

Figure 5:
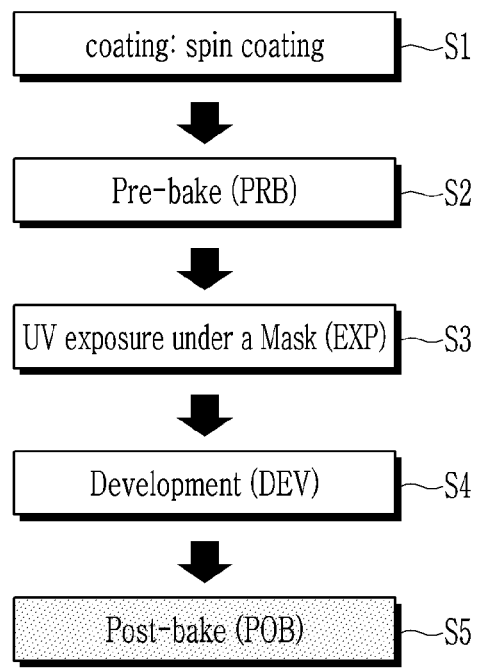
FIG. 5 is a schematic view of a pattern forming process using a composition according to an embodiment.
Figure 5:
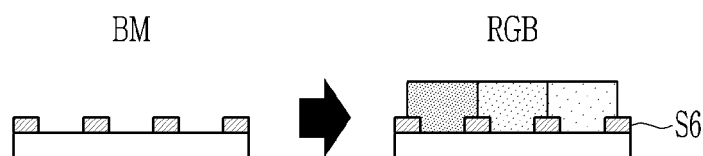

The substrate and the composition are the same as described above. Non-limiting methods of forming the aforementioned pattern are illustrated, referring to FIG. 5.

The composition is coated to have a predetermined thickness on a substrate in an appropriate method of spin coating, slit coating, and the like (S1). The formed film may be, optionally, pre-baked (PRB) (S2). The pre-baking may be performed by selecting an appropriate condition from conditions of a temperature, time, an atmosphere, and the like.

The formed (or optionally pre-baked) film is exposed to light having a predetermined wavelength under a mask having a predetermined pattern (S3). A wavelength and intensity of the light may be selected taking into consideration the (photo)initiator and amounts of the (photo)initiator, the quantum dots and amounts of the quantum dots, and the like.

The exposed film is treated with an alkali developing solution (e.g., dipping or spraying) to dissolve an unexposed region and obtain a desired pattern (S4). The obtained pattern may be, optionally, post-baked (POB) to improve crack resistance and solvent resistance of the pattern, for example, at about 150° C. to about 230° C. for a predetermined time (e.g., greater than or equal to about 10 minutes or greater than or equal to about 20 minutes) (S5).

In an embodiment in which the quantum dot-polymer composite pattern has a plurality of repeating sections, a quantum dot-polymer composite having a desired pattern may be obtained by preparing a plurality of compositions including a quantum dot having desired photoluminescence properties (a photoluminescence peak wavelength and the like) to form each repeating section (e.g., a red light emitting quantum dot, a green light emitting quantum dot, or optionally, a blue light emitting quantum dot) and an appropriate number of times (e.g., twice or more or three times or more) repeating a formation of the above pattern about each composition (S6). For example, the quantum dot-polymer composite may have, e.g., be provided in, a pattern including at least two repeating color sections (e.g., RGB sections). The quantum dot-polymer composite pattern may be used as a photoluminescence-type color filter in a display device.

In an embodiment, the stack structure may be produced using an ink composition. The method may include depositing the same (e.g., to provide a desirable pattern) on the desirable substrate using an appropriate system (e.g., droplet discharging device such as inkjet or nozzle printing device) and heating the same to remove a solvent and to perform a polymerization. The method may provide a highly precise quantum dot-polymer composite film or pattern in a simple and rapid way.

An embodiment provides an electronic device including the quantum dot. The electronic device may include a light emitting diode (LED), an organic light emitting diode (OLED), a sensor, a solar cell, an imaging sensor, or a liquid crystal display (LCD), but is not limited thereto Hereinafter, the embodiments are illustrated in more detail with reference to examples. However, they are exemplary embodiments of the present invention, and the present invention is not limited thereto.

EXAMPLES

Analysis Methods
1. Quantum Dot (Film) Photoluminescence Analysis

A photoluminescence (PL) spectrum of a produced quantum dot-polymer composite film at an irradiation wavelength of 450 nanometers (nm) is obtained using an Otsuka QE-2100 spectrometer.

The quantum dot-polymer composite film is obtained by separating quantum dots from the quantum dot dispersion by a non-solvent precipitation and centrifuge or the like, mixing the separated quantum dots with a predetermined monomer or polymer (e.g., acryl-based polymer, thiolene polymer, or monomer thereof) to provide a mixture, and applying the obtained mixture on a predetermined substrate to cover a barrier film and curing the same. Then, the amount of quantum dots used for providing a quantum dot-polymer composite film for measuring a photo-conversion efficiency is adjusted in the predetermined amount (taking into consideration a weight of the used polymer) in Examples and Comparative Examples.

2. X-Ray Photoelectron Spectroscopy (XPS) Analysis

An XPS element analysis is performed using Quantum 2000 made by Physical Electronics, Inc. under the conditions of an acceleration voltage: 0.5 to kiloelectronvolts (keV), 300 watts (W), and a minimum analysis area: 10×10 square micrometers.

3. Inductively Coupled Plasma-Atomic Emission Spectroscopic Analysis (ICP-AES)

The ICP-AES is performed using Shimadzu ICPS-8100.

4. Photo-Conversion Efficiency (Conversion Efficiency, CE)

The photo-conversion efficiency is a ratio of the amount of the light emitted from the quantum dot-polymer composite film relative to a light dose which the quantum dot polymer composite film absorbs from the excitation light. The total light dose (B) of excitation light (i.e., blue light) is obtained by integrating the luminescent spectrum of the excitation light, and the PL spectrum of the quantum dot polymer composite film is measured, so the light dose (A) of light in a green or red wavelength and the light dose (B') of light in a blue wavelength emitted from the quantum dot polymer composite film are obtained to provide a conversion efficiency by the following equation:

$$A/(B-B') \times 100 = \text{photo-conversion efficiency (\%)}$$

The conversion efficiency as defined above is front photo-conversion efficiency.

5. X-Ray Diffraction (XRD) Analysis

An XRD analysis is performed using a Philips XPert PRO equipment with a power of 3 kilowatts (kW).

Reference Example 1: Preparation of InP Core

Indium acetate and palmitic acid are dissolved in 1-octadecene in a 300 milliliter (mL) reaction vessel, and the reactor is heated to 120° C. under vacuum. The atmosphere in the reactor is substituted with nitrogen after 1 hour. After being heated to a high temperature of about 250° C., a mixed solution of tris(trimethylsilyl) phosphine (TMS3P) and trioctylphosphine is rapidly injected and reacted for 20 minutes. Acetone is added into the reaction solution that is rapidly cooled at a room temperature and centrifuged to provide a precipitate, and the precipitate is dispersed in toluene or cyclohexane. It is confirmed that the InP core has a diameter of about 2 nm. A mole ratio of indium acetate and TMS3P is adjusted to be about 1.5:1.

Example 1

Se is dispersed in trioctylphosphine (TOP) at 120° C. to prepare a Se/TOP solution. S is dispersed in TOP to prepare a S/TOP solution. Aluminum chloride is dispersed and stirred in TOP at 100° C. to prepare an aluminum chloride-TOP adduct (hereinafter, referred to as $AlCl_3$-TOP).

Zinc acetate and oleic acid are dissolved in trioctylamine in a 300 mL reactor and vacuum-treated at 120° C. for 10 minutes to provide a zinc precursor. The atmosphere in the reactor is substituted with nitrogen ($N_2$) and heated to 280° C., and then cooled to a predetermined temperature after passing a predetermined time.

The InP core obtained from Reference Example 1 and a selenium precursor (i.e., Se/TOP obtained by dispersing Se powder in TOP) are added at a predetermined ratio and heated to a high temperature of greater than or equal to 300° C. and reacted for a predetermined time to provide a ZnSe shell.

When the Se precursor is consumed in the reaction system, S/TOP and $ZnCl_2$ are simultaneously added into the reaction system, and after passing the predetermined time, $AlCl_3$-TOP is subsequently added. The reaction is performed for a total of 1 hour to provide a ZnS layer including zinc sulfide.

The obtained final reaction mixture is cooled to a room temperature. Ethanol is added into the cooled final reaction mixture to prepare a precipitate. The obtained precipitate is centrifuged to obtain quantum dots, and the obtained quantum dots are dispersed in toluene or chloroform.

In the reaction, a ratio (mole ratio) of amounts of the zinc precursor, the selenium precursor, and the sulfur precursor is about 6:2:1.7. The zinc precursor is used in about 40 times of the amount of the indium precursor used during forming the core.

In the reaction, the amounts of the used $ZnCl_2$ and $AlCl_3$ are shown in Table 1.

For the prepared quantum dots, the ratio of S and Al is determined from ICP and XPS analyses, and the ratio of S and Cl is determined from ICP and ion chromatography. Some of the results are shown in Table 1 and Table 2 (ICP data). The mole ratio of the selenium with respect to indium (Se:In) is confirmed to be about 16.1:1.

Figure 7:
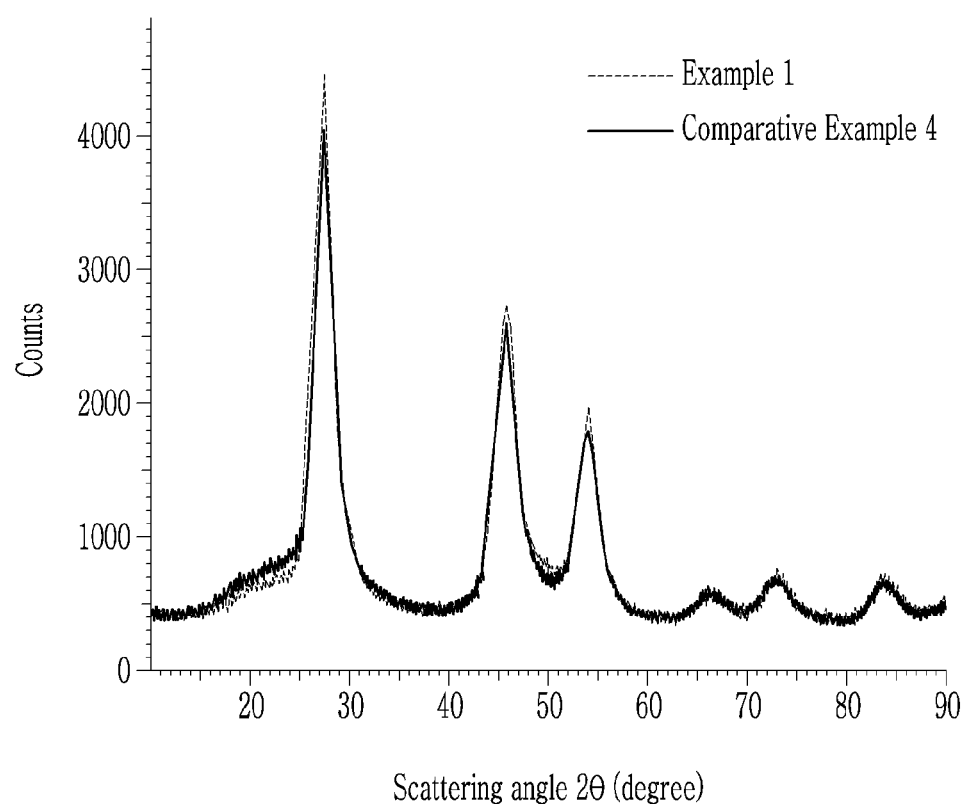
FIG. 7 shows the results of X-ray diffraction spectroscopy for the quantum dot of Example 1 and the quantum dot of Comparative Example 4.

The obtained quantum dots are performed with an X-ray diffraction analysis. Referring to FIG. 7, the obtained quantum dots have a zinc blend phase and have no peak caused by aluminum chloride.

Comparative Example 1

Quantum dots are prepared in accordance with the same procedure as in Example 1, except that the adding $AlCl_3$-TOP is omitted.

In the reaction, the contents of the used $ZnCl_2$ and $AlCl_3$-TOP are shown in Table 1.

For the prepared quantum dots, the ratios of S and Al are determined from ICP and XPS analyses, and the ratios of S and Cl are determined from ICP and ion chromatography. The results are shown in Table 1 and Table 2.

Comparative Example 2

Quantum dots are prepared in accordance with the same procedure as in Example 1, except that $ZnCl_2$ is not used.

In the reaction, the contents of the used $ZnCl_2$ and $AlCl_3$ are shown in Table 1.

For the prepared quantum dots, the ratios of S and Al are determined from ICP and XPS analyses, and the ratios of S and Cl are determined from ICP and ion chromatography. The results are shown in Table 1 and Table 2.

Comparative Example 3

Quantum dots are prepared in accordance with the same procedure as in Example 1, except that aluminum hydroxide stearate ($Al(OH)_2Str$) is used instead of $AlCl_3$-TOP.

In the reaction, the contents of the used $ZnCl_2$ and ($Al(OH)_2Str$) are shown in Table 1.

For the prepared quantum dots, the ratios of S and Al are determined from ICP-AES and XPS analyses, and the ratios of S and Cl are determined from ICP-AES and ion chromatography. The results are shown in Table 1 and Table 2.

Comparative Example 4

Quantum dots are prepared in accordance with the same procedure as in Example 1, except that $ZnCl_2$ is not used, and the adding $AlCl_3$-TOP is omitted.

In the reaction, the contents of the used $ZnCl_2$ and $AlCl_3$-TOP are shown in Table 1.

For the prepared quantum dots, the ratios of S and Al are determined from ICP and XPS analyses, and the ratios of S and Cl are determined from ICP and ion chromatography. The results are shown in Table 1 and Table 2.

The obtained quantum dots are performed with an X-ray diffraction analysis. Referring to FIG. 7, it is confirmed that the obtained quantum dots have a zinc blend phase. The mole ratio of the selenium with respect to indium (Se:In) is about 1:1.

From the results of Table 1, it is confirmed that the quantum dots obtained from Example 1 include aluminum and chlorine in a greatly increased amount in ZnS nanocrystal.

TABLE 2

|  | P:In | (S + Se):In | Zn:In | (S + Se):Zn |
|---|---|---|---|---|
| Example 1 | 0.7:1 | 25.2:1 | 32.3:1 | 1.28:1 |
| Comparative Example 1 | 0.6:1 | 25.4:1 | 31.8:1 | 1.25:1 |
| Comparative Example 2 | 0.6:1 | 26.1:1 | 31.5:1 | 1.20:1 |
| Comparative Example 3 | 0.7:1 | 24.1:1 | 30.0:1 | 1.24:1 |
| Comparative Example 4 | 8.9:1 | 31.7:1 | 15.9:1 | 0.5:1 |

Experimental Example 1: Preparation of Quantum Dot-Polymer Composite and Production of Pattern Thereof (1) Preparation of Quantum Dot-Binder Dispersion Each quantum dot chloroform dispersion according to Example 1 or Comparative Examples 1 to 4 is mixed with a binder (a quaternary copolymer of methacrylic acid, benzyl methacrylate, hydroxyethyl methacrylate, and styrene, acid value: 130 milligrams of potassium hydroxide per gram (mg KOH/g), molecular weight: 8,000, methacrylic acid: benzyl methacrylate:hydroxyethyl methacrylate:styrene (mole ratio)=61.5:12:16.3:10.2) solution (polypropylene glycol monomethyl ether acetate (PGMEA) having a concentration of 30 weight percent (wt %)) to prepare a quantum dot-binder dispersion.

(2) Preparation of Photosensitive Composition

The quantum dot binder dispersion is mixed with hexaacrylate having the following structure as a photopolymerizable monomer, glycoldi-3-mercaptopropionate (hereinafter, 2T) as a thiol compound, an oxime ester compound as an initiator, and $TiO_2$ as a light diffusing agent and PGMEA to prepare a composition.

TABLE 1

|  | Additives | | Content relative to S | | Content relative to Zn | |
|---|---|---|---|---|---|---|
|  |  |  | Al/S × 100% | Cl/S × 100% | Al/Zn × 100% | Cl/Zn × 100% |
| Example 1 | $ZnCl_2$ 0.072 millimoles (mmol) | $AlCl_3$-TOP 0.08 mmol | 27% | 48% | 8.4% | 14.9% |
| Comparative Example 1 | $ZnCl_2$ 0.072 mmol | 0 | 0% | 13% | 0% | 4.0% |
| Comparative Example 2 | 0 | $AlCl_3$-TOP 0.08 mmol | 17% | 25% | 4.9% | 7.2% |
| Comparative Example 3 | $ZnCl_2$ 0.045 mmol | $Al(OH)_2Str$ 0.04 mmol | 5.1% | 8.0% | 4.0% | 4.3% |
| Comparative Example 4 (reference) | 0 | 0 | 0% | 0% | 0% | 0% |

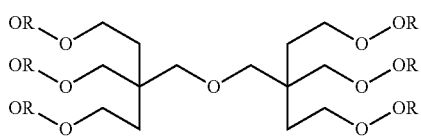

wherein

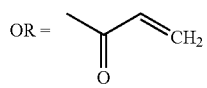

The prepared composition includes 43 wt % of the quantum dot, 12.5 wt % of the binder polymer, 23 wt % of 2 T, 12 wt % of the photopolymerizable monomer, 0.5 wt % of the initiator, and 9 wt % of the light diffusing agent based on a total weight of solids in the composition, and a total solids content of the prepared composition is 25 wt %.

(3) Production of Quantum Dot-Polymer Composite Pattern and Heat Treatment

Each photosensitive composition is spin-coated on a glass substrate at 150 revolutions per minute (rpm) for 5 seconds to obtain films. The films are pre-baked (PRB) at 100° C. These pre-baked films are exposed to irradiation of light (a wavelength: 365 nm, intensity: 100 millijoules (mJ)) for 1 second under a mask having a predetermined pattern (e.g., a square dot or a stripe pattern), developed in a potassium hydroxide aqueous solution (a concentration: 0.043%) for 50 seconds to obtain quantum dot-polymer composite patterns (a thickness: about 6 micrometers (μm)).

The obtained pattern is post-baked (POB) (i.e., heat-treated at 180° C. for 30 minutes) under a nitrogen atmosphere.

For the obtained pattern film, the photo-conversion efficiency after PRB and POB is measured, and the results are shown in Table 3 as the relative efficiency to Comparative Example 4.

TABLE 3

|  | Film characteristics (relative efficiency) | |
| --- | --- | --- |
|  | PRB | POB |
| Example 1 | 113% | 111% |
| Comparative Example 1 | 100% | 103% |
| Comparative Example 2 | 108% | 104% |
| Comparative Example3 | 103% | 103% |
| Comparative Example 4 (reference) | 100% | 100% |

From the results of Table 3, it is confirmed that the quantum dot-polymer composite pattern including quantum dots according to Example 1 have improved photo-conversion efficiency, compared with the quantum dot-polymer composite patterns including quantum dots according to Comparative Examples.

Example 2

Quantum dots having a photoluminescence center wavelength of 532 to 542 nm are synthesized in accordance with the same procedure as in Example 1, except that the core size is controlled by changing a reaction time of core in Reference Example 1.

Figure 6:
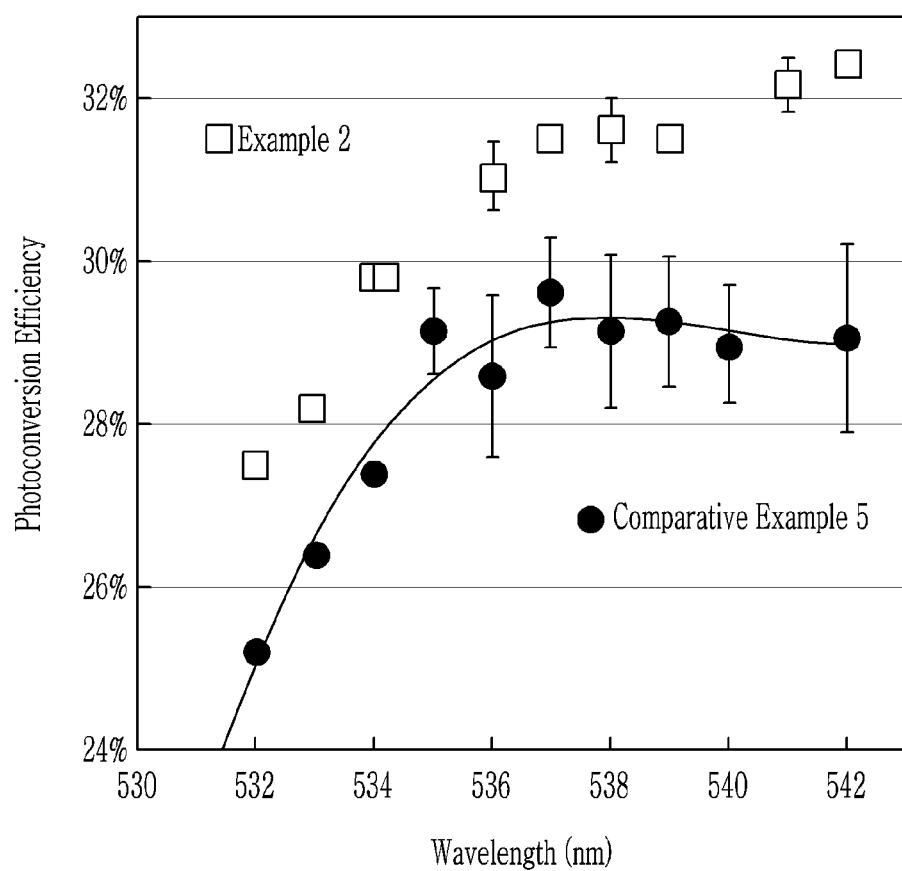
FIG. 6 is a graph of Photoconversion Efficiency (percent (%)) versus Wavelength (nm) showing light conversion efficiency of the quantum dot-polymer composite patterns including the quantum dots produced in Example 2 and Comparative Example 5, respectively.

A quantum dot-polymer composite pattern is prepared in accordance with the same procedure as in Experimental Example 1, using quantum dots. The obtained pattern is measured for a luminous efficiency, and the results are shown in FIG. 6. For the obtained pattern, a process maintenance percent, which is defined by a POB photo-conversion efficiency relative to a PRB photo-conversion efficiency, is calculated. The results show the process maintenance percent of about 96.7%.

Comparative Example 5

Quantum dots having a photoluminescence center wavelength of 532 to 542 nm are synthesized in accordance with the same procedure as in Example 2, except that the adding $AlCl_3$-TOP is omitted.

The obtained pattern is measured for a luminous efficiency, and the results are shown in FIG. 6. For the obtained pattern, a process maintenance percent, which is defined by a POB photo-conversion efficiency relative to a PRB photo-conversion efficiency, is calculated. The results show the process maintenance percent of about 93.9%.

From the results of FIG. 6, it is confirmed that quantum dot-polymer composite pattern including quantum dots according to Example 2 exhibits a higher photo-conversion efficiency after POB than in the quantum dot-polymer composite including quantum dots according to Comparative Example 5. As quantum dots according to Example 2 exhibit an improved conversion efficiency in the same ZnS thickness, compared with the quantum dots according to Comparative Example 5, the thin thickness of the shell (final shell ZnS) may be maintained, contributing to improved absorption.

Comparative Example 6

Quantum dots are prepared in accordance with the same procedure as in Example 1, except that $AlCl_3$-TOP is added in the early stage and the intermediate stage of forming the ZnSe layer. A quantum dot-polymer composite pattern is prepared with the obtained quantum dots in accordance with the same procedure as in Experimental Example 1, and the relative photo-conversion efficiency after PRB and POB is measured, and the results are shown in Table 4.

TABLE 4

|  | Addition of additives | | Single film characteristics (relative efficiency) | |
| --- | --- | --- | --- | --- |
|  |  |  | PRB | POB |
| Comparative Example 6 | $ZnCl_2$ ZnS formation step | $AlCl_3$-TOP Initial ZnSe formation step | 91% | 92% |
|  | $ZnCl_2$ ZnS formation step | $AlCl_3$-TOP In the middle of ZnSe formation step | 94% | 94% |

From the results of Comparative Example 6, it is confirmed that adding Lewis acid base adduct during the forming ZnSe decreases photoluminescence properties of quantum dots.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A method of producing a quantum dot, comprising
preparing a zinc precursor not comprising a halogen;
reacting a Lewis base with sulfur to prepare a sulfur precursor;
reacting a Lewis acid metal halide comprising a metal with the Lewis base to obtain an acid base adduct comprising the metal and halogen; and
reacting the zinc precursor and the sulfur precursor in the presence of the acid base adduct and a zinc halide to form a first semiconductor nanocrystal comprising zinc and sulfur and produce the quantum dot,
wherein the quantum dot comprises
a core and
a shell disposed on the core,
wherein one of the core and the shell comprises the first semiconductor nanocrystal comprising zinc and sulfur and the other of the core and the shell comprises a second semiconductor nanocrystal having a different composition from the first semiconductor nanocrystal.

2. The method of claim 1, wherein the zinc precursor comprises a reaction product of a zinc compound and a fatty acid.

3. The method of claim 1, wherein the Lewis acid metal halide comprises aluminum halide, magnesium halide, gallium halide, antimony halide, titanium halide, or a combination thereof, and
the Lewis base comprises $R_3PO$, wherein, R is a substituted or unsubstituted C1 to C40 aliphatic hydrocarbon group, a substituted or unsubstituted C6 to C40 aromatic hydrocarbon group, or a combination thereof.

4. The method of claim 1, wherein an amount of the Lewis acid metal halide is about 10 mole percent to about 100 mole percent, based on a total number of moles of the sulfur precursor and an amount of the zinc halide is about mole percent to about 100 mole percent, based on a total number of moles of the sulfur precursor.

5. The method of claim 1, wherein the first semiconductor nanocrystal does not comprise selenium.

6. The method of claim 1, wherein the first semiconductor nanocrystal comprises zinc sulfide.

7. The method of claim 1, wherein the second semiconductor nanocrystal comprises a Group II-VI compound, a Group III-V compound, a Group IV-VI compound, a Group IV element or compound, a Group compound, a Group I-II-IV-VI compound, or a combination thereof.

8. The method of claim 1, wherein the second semiconductor nanocrystal comprises InP, InZnP, ZnSe, ZnTeSe, ZnSeS, or a combination thereof.

9. The method of claim 1, wherein the quantum dot does not comprise cadmium.

10. The method of claim 1, wherein the first semiconductor nanocrystal is present in the core.

11. The method of claim 1, wherein the first semiconductor nanocrystal is present in the shell.

12. The method of claim 11, wherein the shell comprises a multi-layered shell comprising two or more layers wherein adjacent layers have different compositions.

13. The method of claim 11, wherein the second semiconductor nanocrystal comprises indium and phosphorus, and a mole ratio of zinc relative to indium is less than or equal to about 40:1.

14. The method of claim 1, wherein the quantum dot further comprises selenium, and a mole ratio of sulfur relative to selenium is less than or equal to about 2:1.

15. The method of claim 1, wherein the quantum dot further comprises selenium, and in the quantum dot, a mole ratio of zinc relative to selenium and sulfur is greater than or equal to about 1.1:1.

16. The method of claim 1, wherein the metal comprises aluminum, magnesium, gallium, antimony, titanium, or a combination thereof.

17. The method of claim 1, wherein the metal comprises aluminum.

18. The method of claim 1, wherein the halogen comprises chlorine and does not comprise fluorine, iodine, and bromine.

19. The method of claim 1, wherein the content of the metal is greater than or equal to about 15 mole percent, based on the total number of moles of sulfur.

20. The method of claim 1, wherein the content of the halogen is greater than or equal to about 15 mole percent, based on the total number of moles of sulfur.

* * * * *